US010134671B1

(12) United States Patent
Kirby

(10) Patent No.: US 10,134,671 B1
(45) Date of Patent: Nov. 20, 2018

(54) 3D INTERCONNECT MULTI-DIE INDUCTORS WITH THROUGH-SUBSTRATE VIA CORES

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/584,965

(22) Filed: May 2, 2017

(51) Int. Cl.
*H01L 29/00* (2006.01)
*H01L 23/522* (2006.01)
*H01L 23/48* (2006.01)

(52) U.S. Cl.
CPC ........ *H01L 23/5227* (2013.01); *H01L 23/481* (2013.01)

(58) Field of Classification Search
CPC ..... H01L 51/56; H01L 33/06; H01L 51/0074; C09K 11/06; C09K 2211/1007
USPC ...................................................... 257/531
See application file for complete search history.

(56) References Cited

U.S. PATENT DOCUMENTS

| 5,095,357 | A | 3/1992 | Andoh et al. |
| 2009/0140383 | A1 | 6/2009 | Chang et al. |
| 2009/0243035 | A1 | 10/2009 | Mashino et al. |
| 2009/0267084 | A1 | 10/2009 | Bilger et al. |
| 2010/0164671 | A1 | 7/2010 | Pagani et al. |
| 2011/0084782 | A1 | 4/2011 | Kanno |
| 2011/0156488 | A1 | 6/2011 | Kuroda |
| 2012/0068301 | A1 | 3/2012 | Sin et al. |
| 2012/0256290 | A1 | 10/2012 | Renna et al. |
| 2013/0056847 | A1* | 3/2013 | Chen ........................ H01L 28/10 257/531 |
| 2013/0063234 | A1 | 3/2013 | Kamath et al. |
| 2013/0168809 | A1 | 7/2013 | Yen et al. |
| 2013/0187255 | A1 | 7/2013 | Wang et al. |
| 2013/0321094 | A1 | 12/2013 | Sumida et al. |
| 2014/0061854 | A1 | 3/2014 | Chen |

(Continued)

FOREIGN PATENT DOCUMENTS

EP 0725407 A1 8/1996
KR 20110011691 U 12/2011

(Continued)

OTHER PUBLICATIONS

U.S. Appl. No. 15/584,278—Unpublished Patent Application by Kyle K. Kirby, titled "Semiconductor Devices With Back-Side Coils for Wireless Signal and Power Coupling", filed May 2, 2017, 35 pages.
U.S. Appl. No. 15/584,310—Unpublished Patent Application by Kyle K. Kirby, titled "Semiconductor Devices With Through-Substrate Coils for Wireless Signal and Power Coupling", filed May 2, 2017, 27 pages.
U.S. Appl. No. 15/584,294—Unpublished Patent Application by Kyle K. Kirby, titled "Inductors With Through-Substrate Via Cores", filed May 2, 2017, 39 pages.

(Continued)

*Primary Examiner* — Andy Huynh
(74) *Attorney, Agent, or Firm* — Perkins Coie LLP

(57) ABSTRACT

A semiconductor device having a first die and a second die is provided. The first die of the device includes a first surface and a through-substrate via (TSV) extending at least substantially through the first die, the TSV having a portion extending past the first surface. The first die further includes a first substantially helical conductor disposed around the TSV. The second die of the device includes a second surface, an opening in the second surface in which the portion of the TSV is disposed, and a second substantially helical conductor disposed around the opening.

12 Claims, 17 Drawing Sheets

(56) References Cited

U.S. PATENT DOCUMENTS

| | | | |
|---|---|---|---|
| 2014/0131841 A1 | 5/2014 | Tseng et al. | |
| 2014/0159196 A1 | 6/2014 | Mackh et al. | |
| 2014/0217546 A1 | 8/2014 | Yen et al. | |
| 2014/0225208 A1* | 8/2014 | Gu | H01L 43/02 257/422 |
| 2014/0323046 A1 | 10/2014 | Asai et al. | |
| 2015/0115405 A1 | 4/2015 | Wu et al. | |
| 2017/0005046 A1 | 1/2017 | Sin et al. | |
| 2017/0330930 A1 | 11/2017 | Cook et al. | |

FOREIGN PATENT DOCUMENTS

| | | |
|---|---|---|
| WO | 2014045518 A1 | 3/2014 |
| WO | 2014123790 A1 | 8/2014 |
| WO | 2016094651 A1 | 6/2016 |

OTHER PUBLICATIONS

U.S. Appl. No. 15/584,881—Unpublished Patent Application by Kyle K. Kirby, titled "Multi-Die Inductors With Coupled Through-Substrate Via Cores", filed May 2, 2017, 41 pages.

International Application No. PCT/US2018/026239—International Search Report and Written Opinion, dated Jul. 26, 2018, 10 pages.

International Application No. PCT/US2018/026253—International Search Report and Written Opinion, dated Jul. 27, 2018, 13 pages.

International Application No. PCT/US2018/026256—International Search Report and Written Opinion, dated Jul. 4, 2018, 16 pages.

International Application No. PCT/US2018/026263—International Search Report and Written Opinion, dated Jul. 4, 2018, 16 pages.

International Application No. PCT/US2018/026269—International Search Report and Written Opinion, dated Jul. 5, 2018, 14 pages.

\* cited by examiner

US 10,134,671 B1

3D INTERCONNECT MULTI-DIE INDUCTORS WITH THROUGH-SUBSTRATE VIA CORES

CROSS-REFERENCE TO RELATED APPLICATION(S)

This application contains subject matter related to a concurrently-filed U.S. Patent Application by Kyle K. Kirby, entitled "SEMICONDUCTOR DEVICES WITH BACK-SIDE COILS FOR WIRELESS SIGNAL AND POWER COUPLING." The related application, of which the disclosure is incorporated by reference herein, is assigned to Micron Technology, Inc., and is identified by Ser. No. 15/584,278.

This application contains subject matter related to a concurrently-filed U.S. Patent Application by Kyle K. Kirby, entitled "SEMICONDUCTOR DEVICES WITH THROUGH-SUBSTRATE COILS FOR WIRELESS SIGNAL AND POWER COUPLING." The related application, of which the disclosure is incorporated by reference herein, is assigned to Micron Technology, Inc., and is identified by Ser. No. 15/584,310.

This application contains subject matter related to a concurrently-filed U.S. Patent Application by Kyle K. Kirby, entitled "INDUCTORS WITH COUPLED THROUGH-SUBSTRATE VIA CORES." The related application, of which the disclosure is incorporated by reference herein, is assigned to Micron Technology, Inc., and is identified by Ser. No. 15/584,294.

This application contains subject matter related to a concurrently-filed U.S. Patent Application by Kyle K. Kirby, entitled "MULTI-DIE INDUCTORS WITH COUPLED THROUGH-SUBSTRATE VIA CORES." The related application, of which the disclosure is incorporated by reference herein, is assigned to Micron Technology, Inc., and is identified by Ser. No. 15/584,881.

TECHNICAL FIELD

The present disclosure generally relates to semiconductor devices, and more particularly relates to semiconductor devices including multi-die inductors with through-substrate via cores, and methods of making and using the same.

BACKGROUND

As the need for miniaturization of electronic circuits continues to increase, the need to minimize various circuit elements, such as inductors, increases apace. Inductors are an important component in many discrete element circuits, such as impedance-matching circuits, linear filters, and various power circuits. Since traditional inductors are bulky components, successful miniaturization of inductors presents a challenging engineering problem.

One approach to miniaturizing an inductor is to use standard integrated circuit building blocks, such as resistors, capacitors, and active circuitry, such as operational amplifiers, to design an active inductor that simulates the electrical properties of a discrete inductor. Active inductors can be designed to have a high inductance and a high Q factor, but inductors fabricated using these designs consume a great deal of power and generate noise. Another approach is to fabricate a spiral-type inductor using conventional integrated circuit processes. Unfortunately, spiral inductors in a single level (e.g., plane) occupy a large surface area, such that the fabrication of a spiral inductor with high inductance can be cost- and size-prohibitive. Accordingly, there is a need for other approaches to the miniaturization of inductive elements in semiconductor devices.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for inductors with high inductance that occupy a small area. These needs are especially acute in multi-die devices with coupled inductors in different dies, where the efficiency of the inductor coupling can depend in part upon the inductors having high inductance. Accordingly, several embodiments of semiconductor devices in accordance with the present technology can provide multi-die coupled inductors having through-substrate via cores, which can provide high inductance and efficient coupling while consuming only a small area.

Several embodiments of the present technology are directed to semiconductor devices comprising multiple dies. In one embodiment, a semiconductor device comprises a first die and a second die. The first die of the device can include a first surface and a through-substrate via (TSV) extending at least substantially through the first die, the TSV having a portion extending past the first surface. The first die can further include a first substantially helical conductor disposed around the TSV. The second die of the device can include a second surface, an opening in the second surface in which the portion of the TSV is disposed, and a second substantially helical conductor disposed around the opening. The first substantially helical conductor can be a non-planar spiral configured to induce a change in a magnetic field in the TSV in response to a first changing current in the first substantially helical conductor, and the second substantially helical conductor can be a non-planar spiral configured to have a second changing current induced therein in response to the change in the magnetic field in the portion of TSV.

Figure 1:
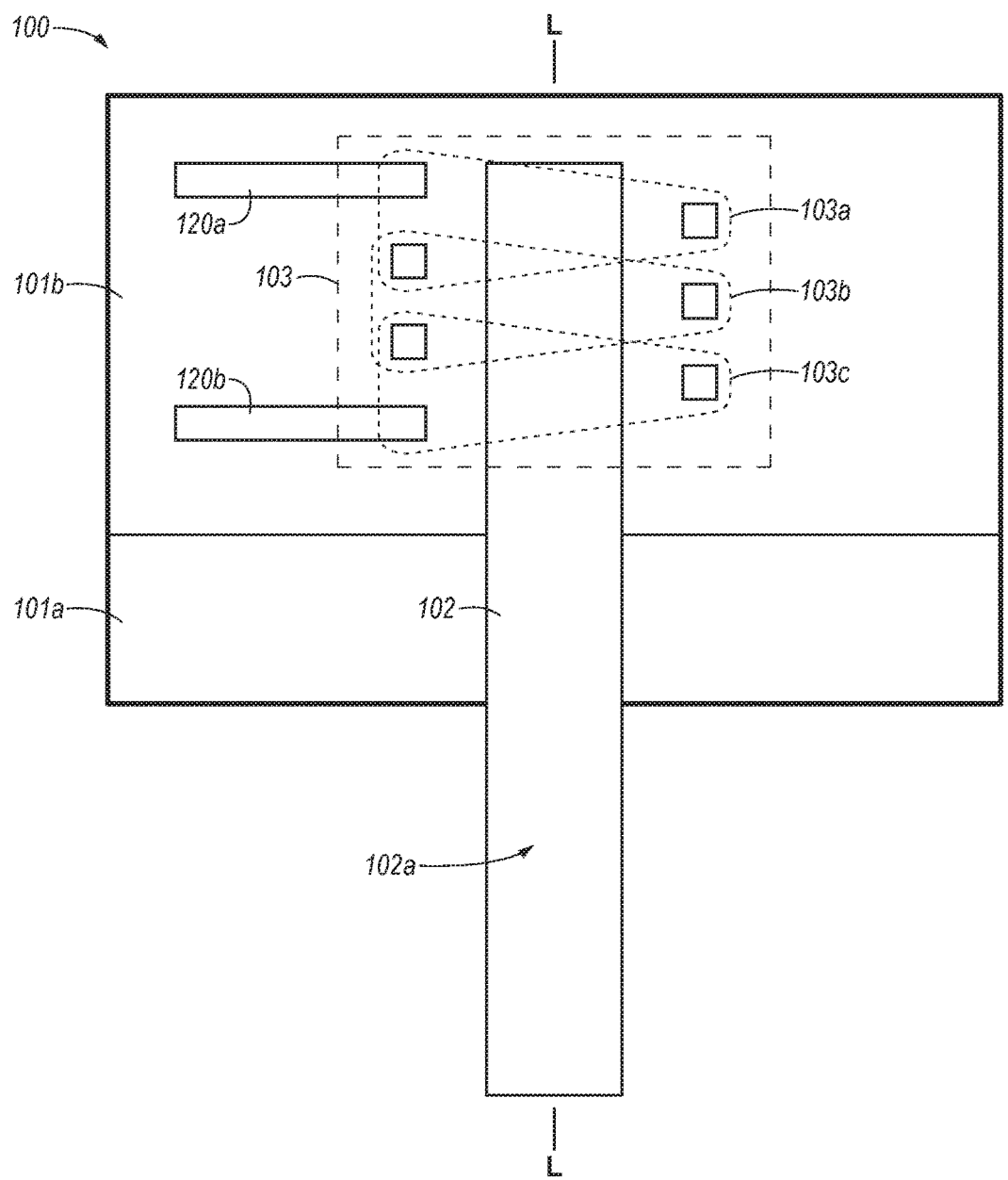
FIG. 1 is a simplified cross-sectional view of a first die of a multi-die semiconductor device in accordance with an embodiment of the present technology.

FIG. 1 is a simplified cross-sectional view of a first die 100 of a multi-die semiconductor device in accordance with an embodiment of the present technology. The first die 100 includes a first substrate 101a and a first insulating material 101b. The first die 100 further includes a TSV 102 that extends at least substantially through the first die 100 (e.g., extending from approximately the top surface of the first insulating material 101b and down through the first substrate 101a), with a portion 102a extending below the bottom surface of the first substrate 101a. The first die 100 also includes a first substantially helical conductor 103 ("conductor 103") disposed around the TSV 102. In the present embodiment, the first conductor 103 is shown to include three complete turns (103a, 103b, and 103c) around the TSV 102. The first conductor 103 can be operably connected to other circuit elements (not shown) by leads 120a and 120b.

The turns 103a-103c of the first conductor 103 are electrically insulated from one another and from the TSV 102. In one embodiment, the first insulating material 101b electrically isolates the first conductor 103 from the TSV 102. In another embodiment, the first conductor 103 can have a conductive inner region covered (e.g., coated) by a dielectric or insulating outer layer. For example, an outer layer of the first conductor 103 can be an oxide layer, and an inner region of the first conductor 103 can be copper, gold, tungsten, or alloys thereof. The TSV 102 can also include an outer layer and a magnetic material within the outer layer. The outer layer can be a dielectric or insulating material (e.g., silicon oxide, silicon nitride, polyimide, etc.) that electrically isolates the magnetic material of the TSV 102 from the first conductor 103. One aspect of the first conductor 103 is that the individual turns 103a-103c define a non-planar spiral with respect to the longitudinal dimension "L" of the TSV 102. Each subsequent turn 103a-103c is at a different elevation along the longitudinal dimension L of the TSV 102 in the non-planar spiral of the first conductor 103.

According to one embodiment of the present technology, the first substrate 101a can be any one of a number of substrate materials suitable for semiconductor processing methods, including silicon, glass, gallium arsenide, gallium nitride, organic laminates, molding compounds (e.g., for reconstituted wafers for fan-out wafer-level processing) and the like. As will be readily understood by those skilled in the art, a through-substrate via, such as the TSV 102, can be made by etching a high-aspect-ratio hole into a substrate material and filling it with one or more materials in one or more deposition and/or plating steps. Accordingly, the TSV 102 extends at least substantially through the first substrate 101a, which is unlike other circuit elements that are additively constructed on top of the first substrate 101a. For example, the first substrate 101a can be a thinned silicon wafer of about 100 μm thickness, and the TSV 102 can extend from near a top surface of the first insulating material 101b, through the first substrate 101a, such that a portion 102a of the TSV 102 protrudes by more than 10 μm from the bottom surface of the first substrate 101a.

Figure 2:
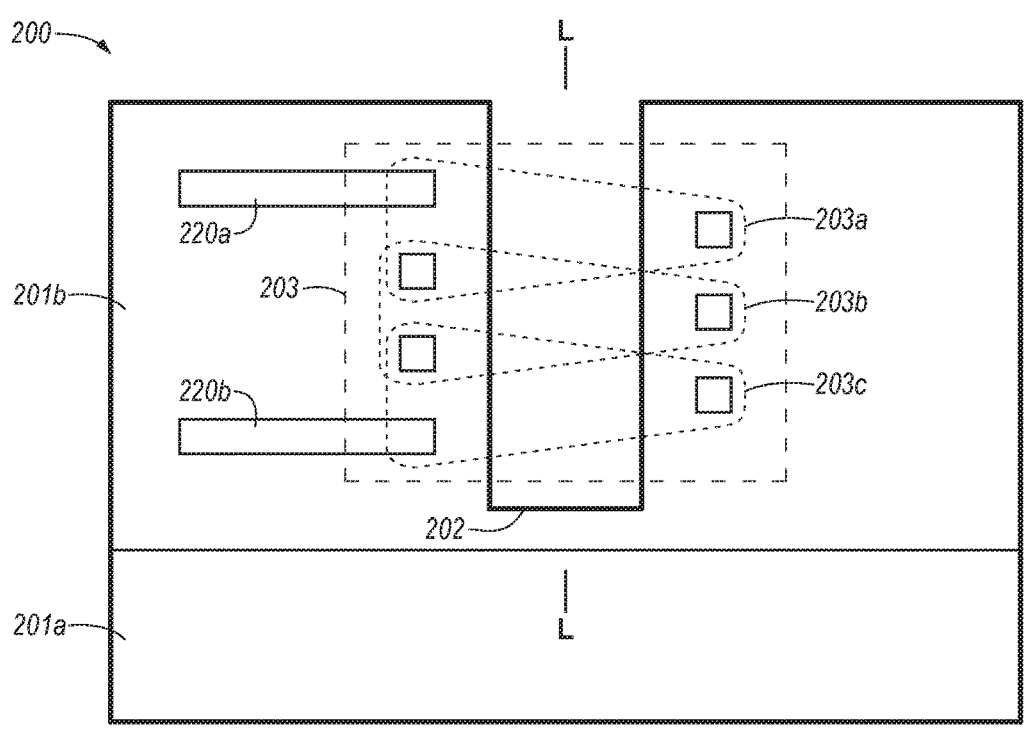
FIG. 2 is a simplified cross-sectional view of a first die of a multi-die semiconductor device in accordance with an embodiment of the present technology.

Turning to FIG. 2, a simplified cross-sectional view of a second die 200 of the multi-die semiconductor device is illustrated in accordance with an embodiment of the present technology. The second die 200 includes a second substrate 201a and a second insulating material 201b. According to one embodiment of the present technology, the second substrate 201a can be any one of a number of substrate materials suitable for semiconductor processing methods, including silicon, glass, gallium arsenide, gallium nitride, organic laminates, molding compounds (e.g., for reconstituted wafers for fan-out wafer-level processing) and the like. The second die 200 further includes an opening 202 extending from a top surface of the second insulating material 201b to nearly a top surface of the second substrate 201a (e.g., with a small layer of the second insulating material 201b covering the second substrate 201a). The second die 200 further includes a second substantially helical conductor 203 ("conductor 203") disposed around the opening 202. In the present embodiment, the second conductor 203 is shown to include three complete turns (203a, 203b, and 203c) around the opening 202. The second conductor 203 can be operably connected to other circuit elements (not shown) by leads 220a and 220b.

Figure 3:
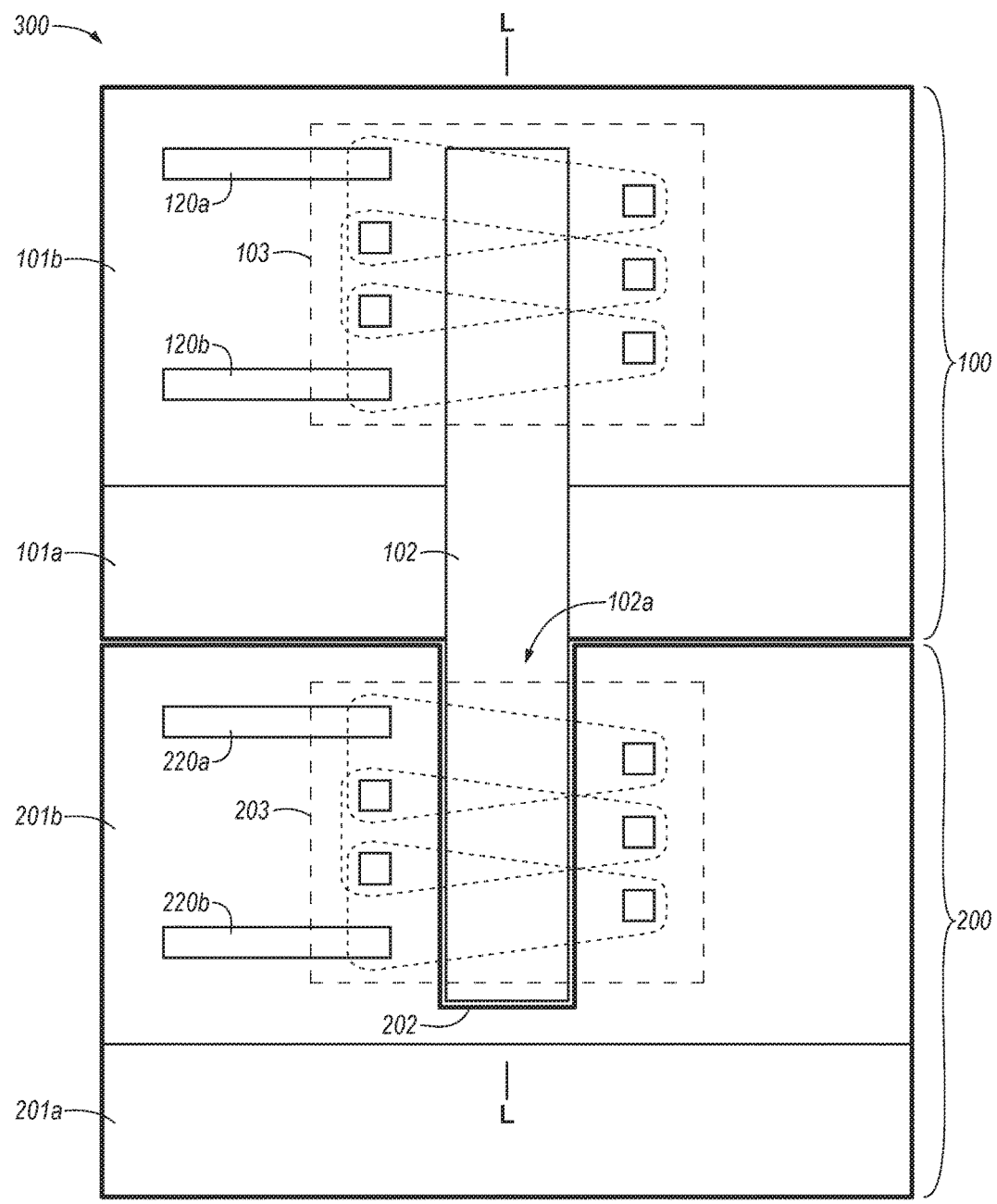
FIG. 3 is a simplified cross-sectional view of a multi-die semiconductor device including coupled inductors with a through-substrate via core configured in accordance with an embodiment of the present technology.

Turning to FIG. 3, a simplified cross-sectional view of the multi-die semiconductor device 300 including the first and second dies 100 and 200 is illustrated in accordance with an embodiment of the present technology. As can be seen with reference to FIG. 3, the portion 102a of the TSV 102 that extends below the bottom surface of the first substrate 101a of the first die 100 is disposed within the opening 202 in the second die 200. Accordingly, the second conductor 203 is disposed around the portion 102a of the TSV 102 (e.g., coaxially with the TSV 102). The three turns 203a-203c of the second conductor 203 are electrically insulated from one another and from the TSV 102. In one embodiment, the insulating material 201b electrically isolates the second conductor 203 from the TSV 102. In another embodiment, the second conductor 203 can have a conductive inner region covered (e.g., coated) by a dielectric or insulating outer layer. For example, an outer layer of the second conductor 203 can be an oxide layer, and an inner region of the second conductor 203 can be copper, gold, tungsten, or alloys thereof. As set forth above, the TSV 102 can also include an outer layer and a magnetic material within the outer layer. The outer layer can be a dielectric or insulating material (e.g., silicon oxide, silicon nitride, polyimide, etc.) that electrically isolates the magnetic material of the TSV 102 from the second conductor 203. One aspect of the second conductor 203 is that the individual turns 203a-203c define a non-planar spiral with respect to the longitudinal dimension "L" of the opening 202. Each subsequent turn 203a-203c is at a different elevation along the longitudinal dimension L of the opening in the non-planar spiral of the second conductor 203. Moreover, the opening 202 may also be partially filled with a mold compound (not shown) or other fill material to eliminate voids or entrapped gasses in the space between an outer surface of the TSV 102 and an inner surface of the opening 202.

According to one embodiment, the first conductor 103 can be configured to induce a magnetic field in the TSV 102 in response to a current passing through the first conductor 103 (e.g., provided by a voltage differential applied across the leads 120a and 120b). By changing the current passing through the first conductor 103 (e.g., by applying an alternating current, or by repeatedly switching between high and low voltage states), a changing magnetic field can be induced in the TSV 102, which in turn induces a changing current in the second conductor 203. In this fashion, signals and/or power can be coupled between a circuit comprising the first conductor 103 and another comprising the second conductor 203.

In another embodiment, the second conductor 203 can be configured to induce a magnetic field in the TSV 102 in response to a current passing through the second conductor 203 (e.g., provided by a voltage differential applied across leads 220a and 220b). By changing the current passing through the second conductor 203 (e.g., by applying an alternating current, or by repeatedly switching between high and low voltage states), a changing magnetic field can be induced in the TSV 102, which in turn induces a changing current in the first conductor 103. In this fashion, signals and/or power can be coupled between a circuit comprising the second conductor 203 and another comprising the first conductor 103.

In accordance with one embodiment of the present technology, the TSV 102 can include a magnetic material (e.g., a material with a higher magnetic permeability than the materials of the first and second substrates 101a and 201a and/or the first and second insulating materials 101b and 201b) to increase the magnetic field in the TSV 102 when current is flowing through the first and/or second conductors 103 and/or 203. The magnetic material can be ferromagnetic, ferrimagnetic, or a combination thereof. The TSV 102 can include more than one material, either in a bulk material of a single composition or in discrete regions of different materials (e.g., coaxial laminate layers). For example, the TSV 102 can include nickel, iron, cobalt, niobium, or alloys thereof.

The TSV 102 can include a bulk material with desirable magnetic properties (e.g., elevated magnetic permeability provided by nickel, iron, cobalt, niobium, or an alloy thereof), or can include multiple discrete layers, only some of which are magnetic, in accordance with an embodiment of the present technology. For example, following a high-aspect ratio etch and a deposition of insulator, the TSV 102 can be provided in a single metallization step filling in the insulated etched hole with a magnetic material. In another embodiment, the TSV 102 can be formed in multiple steps to provide coaxial layers (e.g., two or more magnetic layers separated by one or more non-magnetic layers). For example, multiple conformal plating operations can be performed before a bottom-up fill operation to provide a TSV with a coaxial layer of non-magnetic material separating a core of magnetic material and an outer coaxial layer of magnetic material. In this regard, a first conformal plating step can partially fill and narrow the etched hole with a magnetic material (e.g., nickel, iron, cobalt, niobium, or an alloy thereof), a second conformal plating step can further partially fill and further narrow the hole with a non-magnetic material (e.g., polyimide or the like), and a subsequent bottom-up plating step (e.g., following the deposition of a seed material at the bottom of the narrowed opening) can completely fill the narrowed hole with another magnetic material (e.g., nickel, iron, cobalt, niobium, or an alloy thereof). Such a structure with laminated coaxial layers of magnetic and non-magnetic material can help to reduce eddy current losses in a TSV through which a magnetic flux is passing.

The conductive windings about a TSV core (or about an opening configured to accept a portion of a TSV core) need not be smoothly helical in several embodiments of the present technology. Although the conductors 103 and 203 are illustrated schematically and functionally in FIGS. 1 through 3 as having turns that, in cross section, appear to gradually increase in distance from a surface of a respective substrate, it will be readily understood by those skilled in the art that fabricating a smooth helix with an axis perpendicular to a surface of a substrate presents a significant engineering challenge. Accordingly, a "substantially helical" conductor, as used herein, describes a conductor having turns that are separated along the longitudinal dimension L of the TSV (e.g., the z-dimension perpendicular to the substrate surface), but which are not necessarily smoothly varying in the z-dimension (e.g., the substantially helical shape does not possess arcuate, curved surfaces and a constant pitch angle). Rather, an individual turn of the conductor can have a pitch of zero degrees and the adjacent turns can be electrically coupled to each other by steeply-angled or even vertical connectors (e.g., traces or vias) with a larger pitch, such that a "substantially helical" conductor can have a stepped structure. Moreover, the planar shape traced out by the path of individual turns of a substantially helical conductor need not be elliptical or circular. For the convenience of integration with efficient semiconductor processing methodologies (e.g., masking with cost-effective reticles), individual turns of a substantially helical conductor can trace out a polygonal path in a planar view (e.g., a square, a hexagon, an octagon, or some other regular or irregular polygonal shape around the TSV 102 or the opening 202). Accordingly, a "substantially helical" conductor, as used herein, describes a non-planar spiral conductor having turns that trace out any shape in a planar view (e.g., parallel to the plane of the substrate surface) surrounding a central axis, including circles, ellipses, regular polygons, irregular polygons, or some combination thereof.

Figure 4:
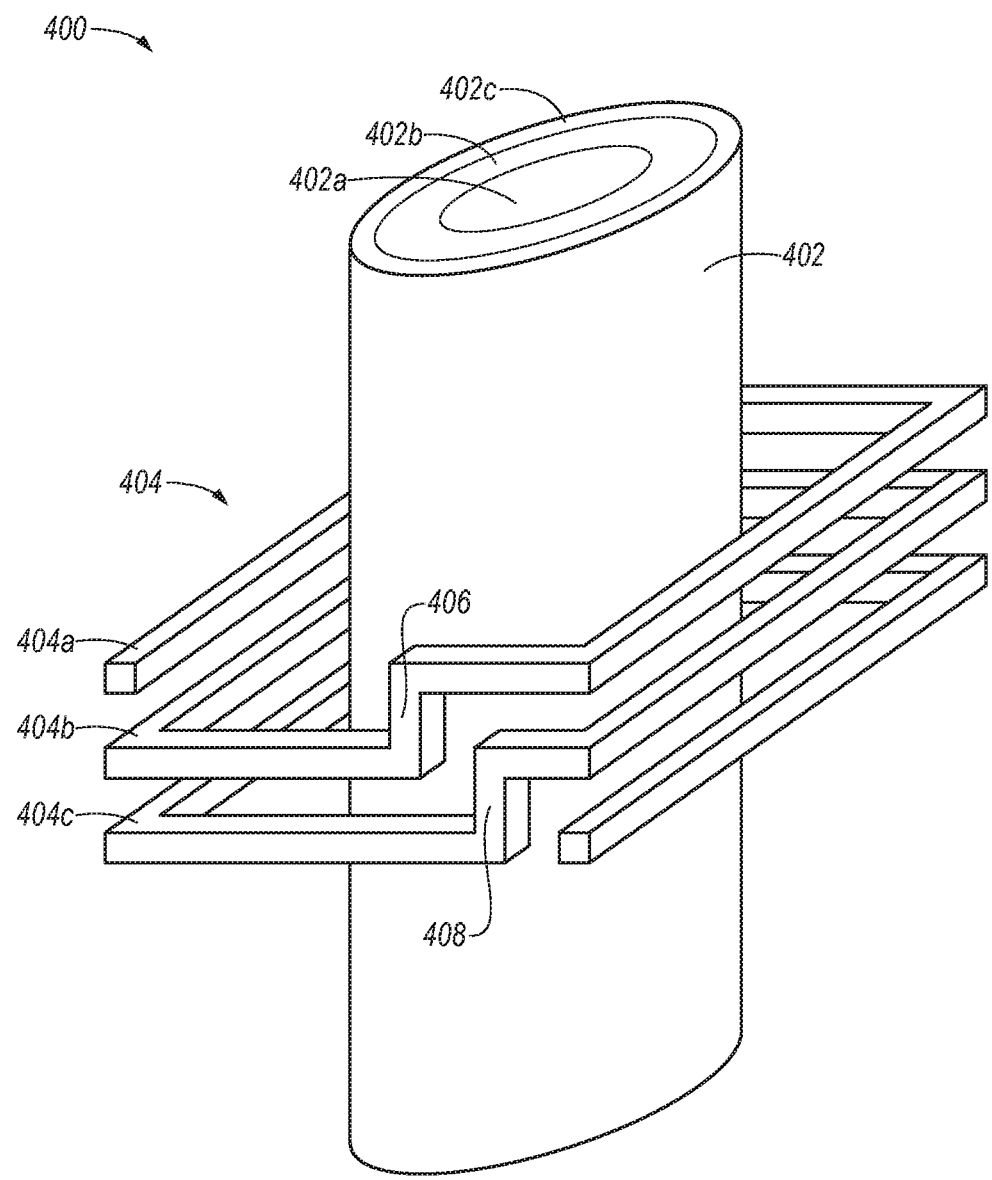
FIG. 4 is a simplified perspective view of a substantially helical conductor disposed around a through-substrate via configured in accordance with an embodiment of the present technology.

FIG. 4 is a simplified perspective view of a substantially helical conductor 404 ("conductor 404") disposed around a through-substrate via 402 configured in accordance with an embodiment of the present technology. For more easily illustrating the substantially helical shape of the conductor 404 illustrated in FIG. 4, the substrate material, insulating materials, and other details of the device in which the conductor 404 and the TSV 402 are disposed have been eliminated from the illustration. As can be seen with reference to FIG. 4, the conductor 404 is disposed coaxially around the TSV 402. The conductor 404 of this particular embodiment has three turns (404a, 404b, and 404c) about the TSV 402. As described above, rather than having a single pitch angle, the conductor 404 has a stepped structure, whereby turns with a pitch angle of 0 (e.g., turns laying in a plane of the device 400) are connected by vertical connecting portions that are staggered circumferentially around the turns. In this regard, planar turns 404a and 404b are connected by a vertical connecting portion 406, and planar turns 404b and 404c are connected by a vertical connecting portion 408. This stepped structure facilitates fabrication of the conductor 404 using simple semiconductor processing techniques (e.g., planar metallization steps for the turns and via formation for the vertical connecting portions). Moreover, as shown in FIG. 4, the turns 404a, 404b, and 404c of the conductor 404 trace a rectangular shape around the TSV 402 when oriented in a planar view.

In accordance with one embodiment, the TSV 402 can optionally (e.g., as shown with dotted lines) include a core material 402a surrounded by one or more coaxial layers, such as layers 402b and 402c. For example, the core 402a and the outer coaxial layer 402c can include magnetic materials, while the middle coaxial layer 402b can include a non-magnetic material, to provide a laminate structure that can reduce eddy current losses. Although the TSV 402 is illustrated in FIG. 4 as optionally including a three-layer structure (e.g., a core 402a surrounded by two coaxially laminated layers 402b and 402c), in other embodiments any number of coaxial laminate layers can be used to fabricate a TSV.

Although in the foregoing examples, substantially helical conductors having three turns about a TSV (or an opening configured to accept a portion of a TSV) have been shown, the number of turns of a substantially helical conductor around a TSV can vary in accordance with different embodiments of the technology. As is shown in the example embodiment of FIG. 4, a substantially helical conductor need not make an integer number of turns about a TSV (e.g., the top and/or bottom turn may not be a complete turn). Providing more turns can increase the inductance of an inductor compared to having fewer turns, but at an increase in the cost and complexity of fabrication (e.g., more fabrication steps). The number of turns can be as low as one, or as high as is desired. When coupled inductors are provided with the same number of windings, they can couple two electrically isolated circuits without stepping up or down the voltage from the primary winding.

Figure 5:
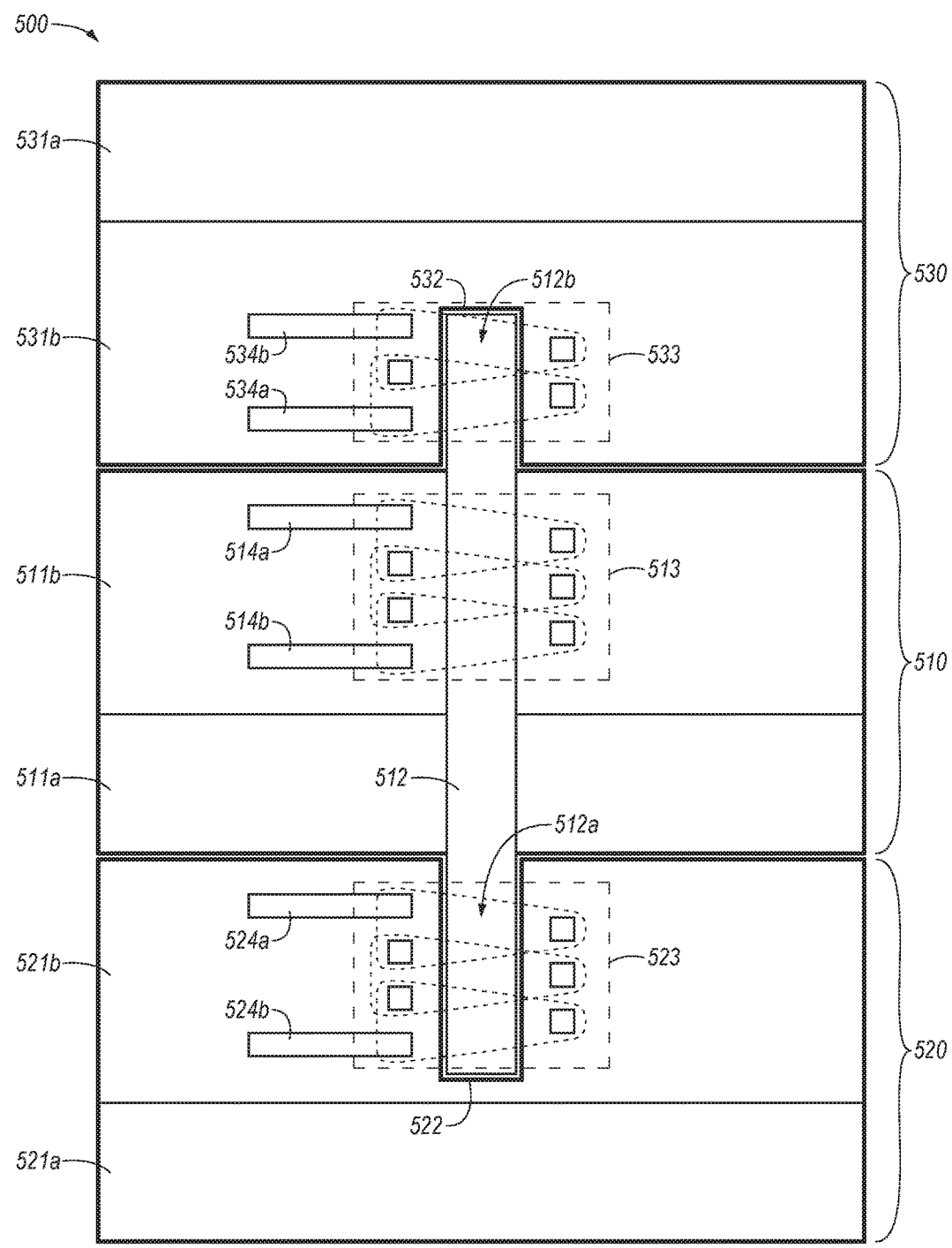
FIG. 5 is a simplified cross-sectional view of a multi-die semiconductor device including coupled inductors with a through-substrate via core configured in accordance with an embodiment of the present technology.

Although the foregoing embodiments of FIGS. 1 and 3 have illustrated semiconductor devices with two dies, in other embodiments of the present technology, semiconductor devices can include three dies in which coupled inductors share a single TSV. For example, FIG. 5 is a simplified cross-sectional view of a multi-die semiconductor device including coupled inductors with TSV cores configured in accordance with an embodiment of the present technology. The device 500 includes a first die 510, a second die 520 and a third die 530. The first die 510 includes a first substrate 511a and a first insulating material 511b. The first die further includes a TSV 512 that extends at least substantially through the first die 510 (e.g., extending entirely through both the first insulating material 511b and the first substrate 511a), with a first portion 512a extending below the bottom surface of the substrate 511a, and a second portion 512b extending above the top surface of the first insulating material 511b. The first die 510 also includes a substantially helical conductor 513 ("conductor 513") disposed around the TSV 512. In the present embodiment, the conductor 513 is shown to include three complete turns around the TSV 512. The first conductor 513 can be operably connected to other circuit elements (not shown) by leads 514a and 514b.

The second die 520 is disposed below the first die 510. The second die 520 includes a second substrate 521a and a second insulating material 521b. According to one embodiment of the present technology, the second substrate 521a can be any one of a number of substrate materials suitable for semiconductor processing methods, including silicon, glass, gallium arsenide, gallium nitride, organic laminates, molding compounds (e.g., for reconstituted wafers for fan-out wafer-level processing) and the like. The second die 520 further includes an opening 522 extending from a top surface of the second insulating material 521b to nearly a top surface of the second substrate 521a (e.g., with a small layer of the second insulating material 521b covering the second substrate 521a). The second die 520 further includes a second substantially helical conductor 523 ("conductor 523") disposed around the opening 522. In the present embodiment, the second conductor 523 is shown to include three complete turns around the opening 522. The second conductor 523 can be operably connected to other circuit elements (not shown) by leads 524a and 524b.

As can be seen with reference to FIG. 5, the portion 512a of the TSV 512 that extends below the bottom surface of the first substrate 511a of the first die 510 is disposed within the opening 522 in the second die 520. Accordingly, the second conductor 523 is disposed around the portion 512a of the TSV 512 (e.g., coaxially with the TSV 512). The three turns of the second conductor 523 are electrically insulated from one another and from the TSV 512. Moreover, the opening 522 may also be partially filled with a mold compound (not shown) or other fill material to eliminate voids or entrapped gasses in the space between an outer surface of the TSV 512 and an inner surface of the opening 522.

The third die 530 is disposed above the first die 510 in a face-to-face arrangement (e.g., the third die 530 is oriented "upside-down" with respect to the first die 510, such that a top surface of the third die is oriented below the bottom surface thereof in FIG. 5). The third die 530 includes a third substrate 531a and a third insulating material 531b. According to one embodiment of the present technology, the third substrate 531a can be any one of a number of substrate materials suitable for semiconductor processing methods, including silicon, glass, gallium arsenide, gallium nitride, organic laminates, molding compounds (e.g., for reconstituted wafers for fan-out wafer-level processing) and the like. The third die 530 further includes an opening 532 extending from a top surface of the third insulating material 531b (e.g., the surface of the third insulating material 531b opposite the third substrate 531a) to nearly a top surface of the third substrate 531a (e.g., with a small layer of the third insulating material 531b covering the third substrate 531a). The third die 530 further includes a third substantially helical conductor 533 ("conductor 533") disposed around the opening 532. In the present embodiment, the third conductor 533 is shown to include two complete turns around the opening 532. The third conductor 533 can be operably connected to other circuit elements (not shown) by leads 534a and 534b.

As can be seen with reference to FIG. 5, the portion 512b of the TSV 512 that extends above the top surface of the first insulating material 511b of the first die 510 is disposed within the opening 532 in the third die 530. Accordingly, the third conductor 533 is disposed around the portion 512b of the TSV 512 (e.g., coaxially with the TSV 512). The two turns of the third conductor 533 are electrically insulated from one another and from the TSV 512. Moreover, the opening 532 may also be partially filled with a mold compound (not shown) or other fill material to eliminate voids or entrapped gasses in the space between an outer surface of the TSV 512 and an inner surface of the opening 532.

According to one embodiment, the first conductor 513 can be configured to induce a magnetic field in the TSV 512 in response to a current passing through the first conductor 513 (e.g., provided by a voltage differential applied across the leads 514a and 514b). By changing the current passing through the first conductor 513 (e.g., by applying an alternating current, or by repeatedly switching between high and low voltage states), a changing magnetic field can be induced in the TSV 512, which in turn induces a changing current in the second conductor 523 and the third conductor 533. In this fashion, signals and/or power can be coupled between a circuit comprising the first conductor 513 and others comprising the second and third conductors 523 and 533.

In accordance with one embodiment of the present technology, the TSV 512 can include a magnetic material (e.g., a material with a higher magnetic permeability than the substrate materials 511a, 521a and 531a and/or the insulating materials 511b, 521b and 531b) to increase the magnetic field in the TSV 512 when current is flowing through one of the three conductors 513, 523 and 533. The magnetic material can be ferromagnetic, ferrimagnetic, or a combination thereof. The TSV 512 can include more than one material, either in a bulk material of a single composition or in discrete regions of different materials (e.g., coaxial laminate layers). For example, the TSV 512 can include nickel, iron, cobalt, niobium, or alloys thereof. Laminated layers of magnetic and non-magnetic material can help to reduce eddy current losses in the TSV 512.

The TSV 512 can include a bulk material with desirable magnetic properties (e.g., elevated magnetic permeability provided by nickel, iron, cobalt, or niobium, or an alloy thereof), or can include multiple discrete layers, only some of which are magnetic, in accordance with an embodiment of the present technology. For example, following a high-aspect ratio etch and a deposition of insulator, the TSV 512 can be provided in a single metallization step filling in the insulated etched hole with a magnetic material, or in multiple laminating steps providing coaxial layers (e.g., multiple magnetic layers separated by non-magnetic layers such as polyimide). In one embodiment, to provide a TSV with a multiple layer structure, a mixture of conformal and bottom-up fill plating operations can be utilized (e.g., one or more conformal plating steps to partially fill and narrow the etched opening with one or more materials, and a subsequent bottom-up plating step to completely fill the narrowed opening with another material).

As is shown in FIG. 5, the third conductor 533 has a different number of turns than the first and second conductors 513 and 523. As will be readily understood by one skilled in the art, this arrangement allows the device 500 to be operated as a step-up or step-down transformer (depending upon which conductor is utilized as the primary winding and which the secondary winding). For example, the application of a first changing current (e.g., 3V of alternating current) to the first conductor 513 will induce a changing current with a lower voltage (e.g., 2V of alternating current) in the third conductor 533, given the 3:2 ratio of turns between the primary and secondary windings in this configuration. When operated as a step-up transformer (e.g., by utilizing the third conductor 533 as the primary winding, and the first and second conductors 513 and 523 as the secondary windings), the application of a first changing current (e.g., 4V of alternating current) to the third conductor 533 will induce changing currents with higher voltages (e.g., 6V of alternating current) in the first and second conductors 513 and 523, given the 2:3 ratio of turns between the primary and secondary windings in this configuration.

In accordance with one aspect of the present technology, the exposed portion of a TSV in a first die, together with a complementary opening in a second die, allows a three-dimensional interconnection ("3DI") between dies so configured to be made. Unlike TSVs configured to carry electrical signals, however, the TSV that forms the magnetic core of a multi-die coupled inductor configuration need not be electrically connected to any circuit elements. Accordingly, many of the steps utilized to improve the electrical connection between TSVs and other circuit elements (e.g., under bump metallization, solder ball formation, solder reflow, etc.) can be omitted from a manufacturing method of the device 500, in accordance with one embodiment of the present technology. Such an advantageous omission can facilitate the simpler connection of dies having a high number or a high density of such 3DIs, as is illustrated in greater detail with respect to FIG. 6.

Figure 6:
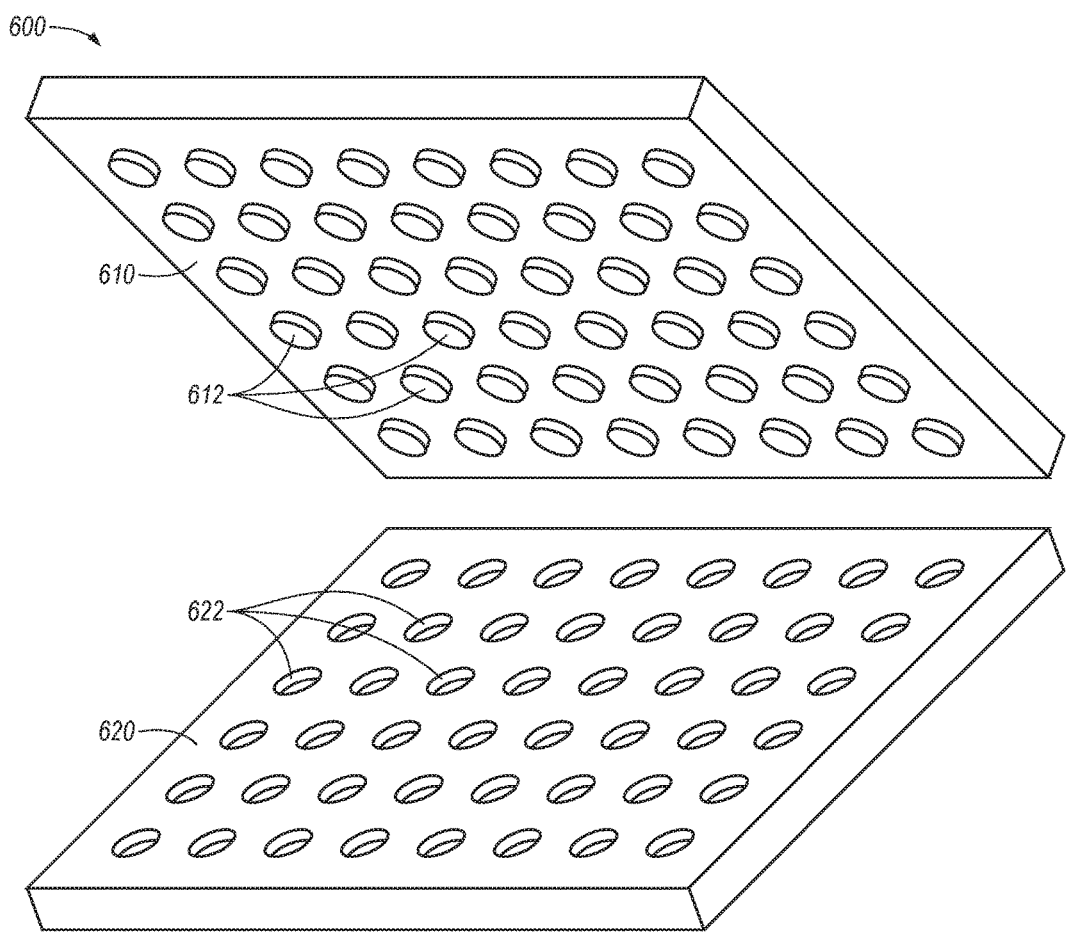
FIG. 6 is a simplified perspective exploded view of a multi-die semiconductor device including coupled inductors with through-substrate via cores configured in accordance with an embodiment of the present technology.

Turning to FIG. 6, a simplified perspective exploded view of a multi-die semiconductor device 600 including coupled inductors with through-substrate via cores is illustrated in accordance with an embodiment of the present technology. As can be seen with reference to FIG. 6, device 600 includes a first die 610 having a plurality of TSVs 612 (only one labeled) each with an exposed portion extending below a lower surface of the first die 610, and device 600 further includes a second die 620 having a plurality of openings 622 (only one labeled) configured to receive the exposed portions of the TSVs of the first die 610. The TSVs 612 each have one or more substantially helical conductors disposed therearound in a coaxial arrangement, as set forth in greater detail above. The openings 622 each have one or more substantially helical conductors disposed therearound in a coaxial arrangement, as set forth in greater detail above, such that when the exposed portions of the TSVs 612 are disposed in the openings 622, the substantially helical conductor around each opening 622 will be disposed around the portion of the TSV 612 extending into the second die 620.

Figure 7:
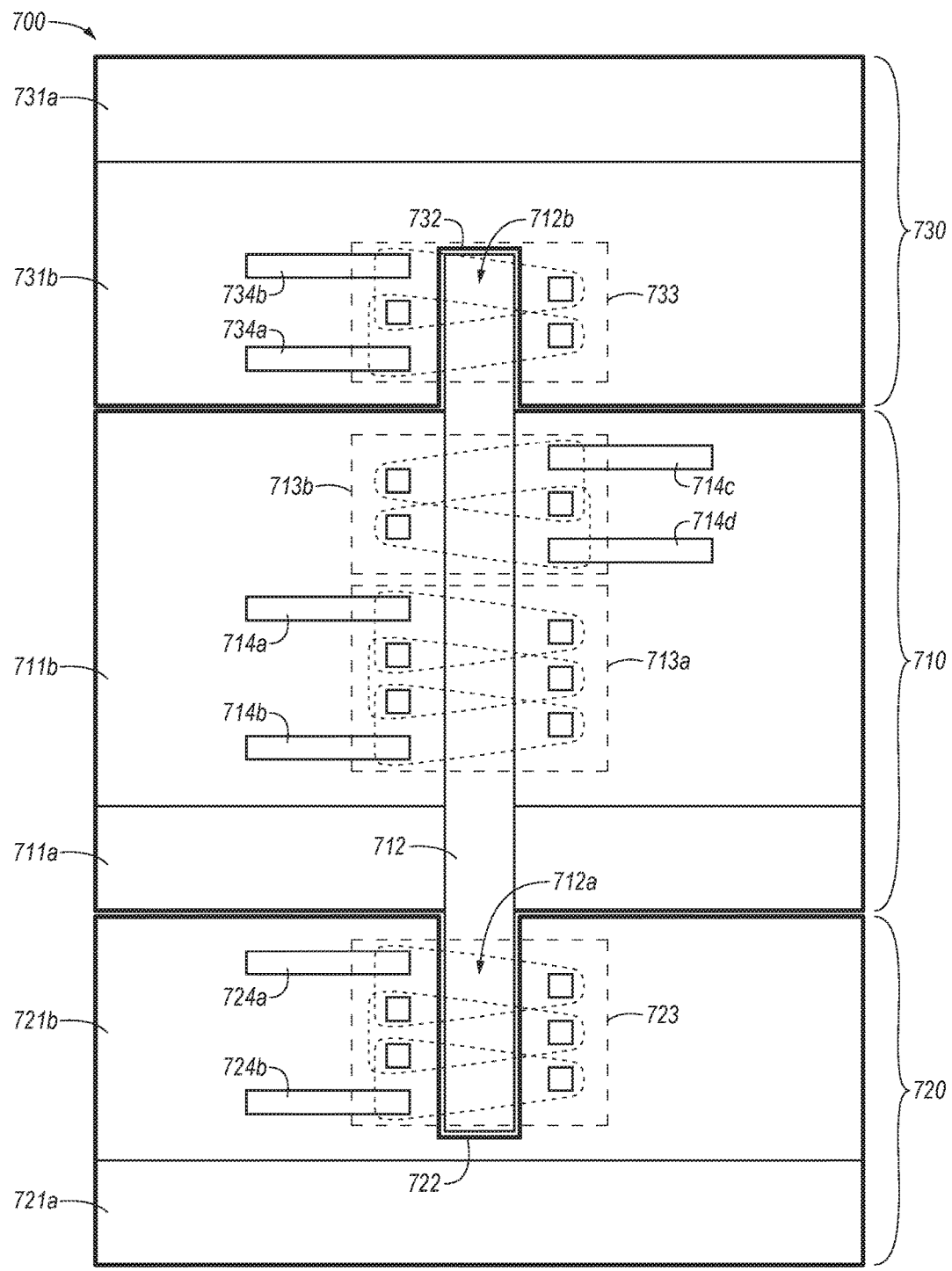
FIG. 7 is a simplified cross-sectional view of a multi-die semiconductor device including coupled inductors with a through-substrate via core configured in accordance with an embodiment of the present technology.

Although the foregoing embodiments have illustrated multi-die semiconductor devices with a single substantially helical conductor in each die, other embodiments of the present technology can be configured with more than one such conductor in a single die, as set forth in greater detail below. For example, FIG. 7 is a simplified cross-sectional view of a multi-die semiconductor device 700 including coupled inductors with a TSV core configured in accordance with an embodiment of the present technology. The device 700 includes a first die 710, a second die 720 and a third die 730. The first die 710 includes a first substrate 711a and a first insulating material 711b. The first die further includes a TSV 712 that extends at least substantially through the first die 710 (e.g., extending entirely through both the first insulating material 711b and the first substrate 711a), with a first portion 712a extending below the bottom surface of the first substrate 711a, and a second portion 712b extending above the top surface of the first insulating material 711b. The first die 710 also includes a first substantially helical conductor 713a ("conductor 713a") disposed around a first part of the TSV 712. In the present embodiment, the first conductor 713a is shown to include three complete turns around the TSV 712. The first conductor 713a can be operably connected to other circuit elements (not shown) by leads 714a and 714b. The first die 710 also includes a second substantially helical conductor 713b ("conductor 713b") disposed around a second part of the TSV 712. In the present embodiment, the second conductor 713b is shown to include two complete turns around the TSV 712. The second conductor 713b can be operably connected to other circuit elements (not shown) by leads 714c and 714d.

The second die 720 is disposed below the first die 710. The second die includes a second substrate 721a and a second insulating material 721b. The second die 720 further includes an opening 722 extending from a top surface of the second insulating material 721b to nearly a top surface of the second substrate 721a (e.g., with a small layer of the second insulating material 721b covering the second substrate 721a). The second die 720 further includes a third substantially helical conductor 723 ("conductor 723") disposed around the opening 722. In the present embodiment, the third conductor 723 is shown to include three complete turns around the opening 722. The third conductor 723 can be operably connected to other circuit elements (not shown) by leads 724a and 724b.

As can be seen with reference to FIG. 7, the first portion 712a of the TSV 712 that extends below the bottom surface of the first substrate 711a of the first die 710 is disposed within the opening 722 in the second die 720. Accordingly, the third conductor 723 is disposed around the portion 712a of the TSV 712 (e.g., coaxially with the TSV 712). The three turns of the third conductor 723 are electrically insulated from one another and from the TSV 712. Moreover, the opening 722 may also be partially filled with a mold compound (not shown) or other fill material to eliminate voids or entrapped gasses in the space between an outer surface of the TSV 712 and an inner surface of the opening 722.

The third die 730 is disposed above the first die 710 in a face-to-face arrangement (e.g., the third die 730 is oriented "upside-down" with respect to the first die, such that a top surface of the third die is oriented below the bottom surface in FIG. 7). The third die includes a third substrate 731a and a third insulating material 731b. The third die 730 further includes an opening 732 extending from a top surface of the third insulating material 731b (e.g., the surface of the third insulating material 731b opposite the third substrate 731a) to nearly a top surface of the third substrate 731a (e.g., with a small layer of the third insulating material 731b covering the third substrate 731a). The third die 730 further includes a fourth substantially helical conductor 733 ("conductor 733") disposed around the opening 732. In the present embodiment, the fourth conductor 733 is shown to include two complete turns around the opening 732. The fourth conductor 733 can be operably connected to other circuit elements (not shown) by leads 734a and 734b.

As can be seen with reference to FIG. 7, the second portion 712b of the TSV 712 that extends above the top surface of the first insulating material 711b of the first die 710 is disposed within the opening 732 in the third die 730. Accordingly, the fourth conductor 733 is disposed around the second portion 712b of the TSV 712 (e.g., coaxially with the TSV 712). The two turns of the fourth conductor 733 are electrically insulated from one another and from the TSV 712. Moreover, the opening 732 may also be partially filled with a mold compound (not shown) or other fill material to eliminate voids or entrapped gasses in the space between an outer surface of the TSV 712 and an inner surface of the opening 732.

According to one embodiment, one of the conductors around the TSV 712, for example the first conductor 713a, can be configured to induce a magnetic field in the TSV 712 in response to a current passing through the first conductor 713a (e.g., provided by a voltage differential applied across the leads 714a and 714b). By changing the current passing through the first conductor 713a (e.g., by applying an alternating current, or by repeatedly switching between high and low voltage states), a changing magnetic field can be induced in the TSV 712, which in turn induces a changing current in the second conductor 713b, the third conductor 723 and the fourth conductor 733. In this fashion, signals and/or power can be coupled between a circuit comprising the first conductor 713a and others comprising the second, third and fourth conductors 713b, 723 and 733.

Although FIG. 7 illustrates an embodiment having a die with two substantially helical conductors or windings disposed around a TSV at two different heights (e.g., coaxially but not concentrically), in other embodiments, multiple substantially helical conductors with different diameters can be provided at the same height (e.g., with radially-spaced conductive turns in the same layers). As the inductance of a substantially helical conductor depends, at least in part, on its diameter and radial spacing from the TSV around which it is disposed, such an approach can be used where a reduction in the number of layer processing steps is more desirable than an increase in the inductance of the substantially helical conductor so radially spaced.

Figure 8:
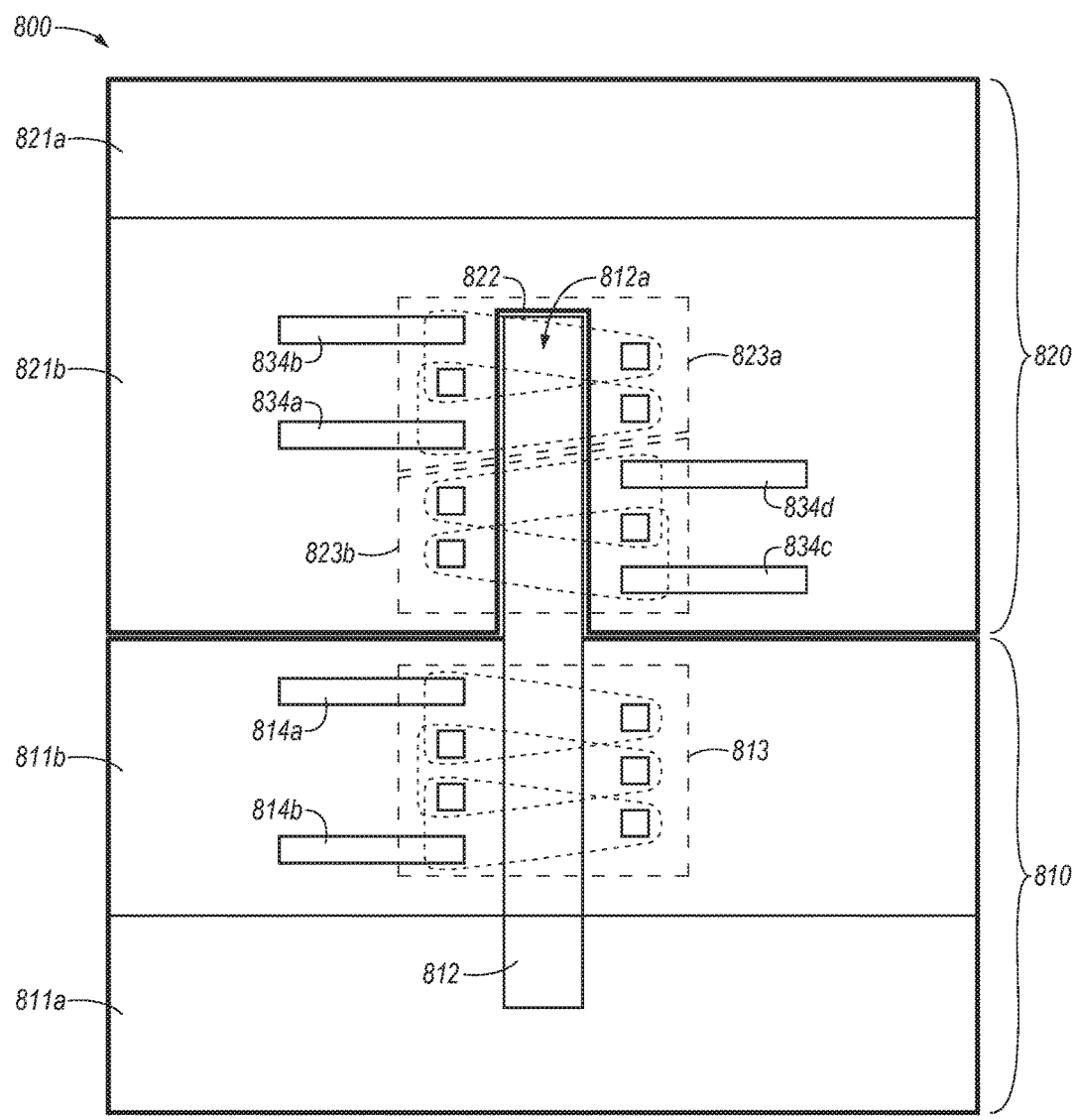
FIG. 8 is a simplified cross-sectional view of a multi-die semiconductor device including coupled inductors with a through-substrate via core configured in accordance with an embodiment of the present technology.

Turning to FIG. 8, a simplified cross-sectional view of a multi-die semiconductor device 800 including coupled inductors with a through-substrate via core is illustrated in accordance with an embodiment of the present technology. The device includes a first die 810 and a second die 820. The first die 810 includes a first substrate 811a and a first insulating material 811b. The first die 810 further includes a through-substrate via (TSV) 812 with a first part in the first substrate material 811a and a second part extending through the first insulating material 811b. The TSV 812 accordingly extends into of the first substrate material 811a and through the first insulating material 811b, with a portion 812a extending beyond a top surface of the first insulating material 811b. The first die 810 also includes a first substantially helical conductor 813 ("conductor 813") disposed around the TSV 812. In the present embodiment, the first conductor 813 is shown to include three complete turns around the TSV 812, with the turns disposed within the insulating material 811b. The first conductor 813 can be operably connected to other circuit elements (not shown) by leads 814a and 814b. The turns of the first conductor 813 are electrically insulated from one another and from the TSV 812.

The second die 820 is disposed above the first die 810 in a face-to-face arrangement (e.g., the second die 820 is oriented "upside-down" with respect to the first die 810, such that a top surface of the second die 820 is oriented below the bottom surface thereof in FIG. 8). The second die 820 includes a second substrate 821a and a second insulating material 821b. The second die 820 further includes an opening 822 extending from a top surface of the second insulating material 821b (e.g., the surface of the insulating material 821b opposite the substrate 821a) to nearly a top surface of the second substrate 821a (e.g., with a small layer of insulating material 821b covering the substrate 821a). The second die 820 further includes a second substantially helical conductor 823a ("conductor 823a") disposed around the opening 822, and a third substantially helical conductor 823b ("conductor 823b") also disposed around the opening 822. In the present embodiment, the second and third conductor 823a and 823b are shown to each include two complete turns around the opening 822. The second conductor 823a can be operably connected to other circuit elements (not shown) by leads 834a and 834b, and the third conductor 823b can be operably connected to other circuit elements (not shown) by leads 834c and 834d.

As can be seen with reference to FIG. 8, the portion 812a of the TSV 812 that extends above the top surface of the first insulating material 811b of the first die 810 is disposed within the opening 822 in the second die 820. Accordingly, the second and third conductors 823a and 823b are disposed around the portion 812a of the TSV 812 (e.g., coaxially with the TSV 812). The two turns of each of the second and third conductors 823a and 823b are electrically insulated from one another and from the TSV 812. Moreover, the opening 822 may also be partially filled with a mold compound (not shown) or other fill material to eliminate voids or entrapped gasses in the space between an outer surface of the TSV 812 and an inner surface of the opening 822.

According to one embodiment, the first conductor 813 can be configured to induce a magnetic field in the TSV 812 in response to a current passing through the first conductor 813 (e.g., provided by a voltage differential applied across the leads 814a and 814b). By changing the current passing through the first conductor 813 (e.g., by applying an alternating current, or by repeatedly switching between high and low voltage states), a changing magnetic field can be induced in the TSV 812, which in turn induces a changing current in the second conductor 823a and the third conductor 823b. In this fashion, signals and/or power can be coupled between a circuit comprising the first conductor 813 and others comprising the second and third conductors 823a and 823b.

Figure 9:
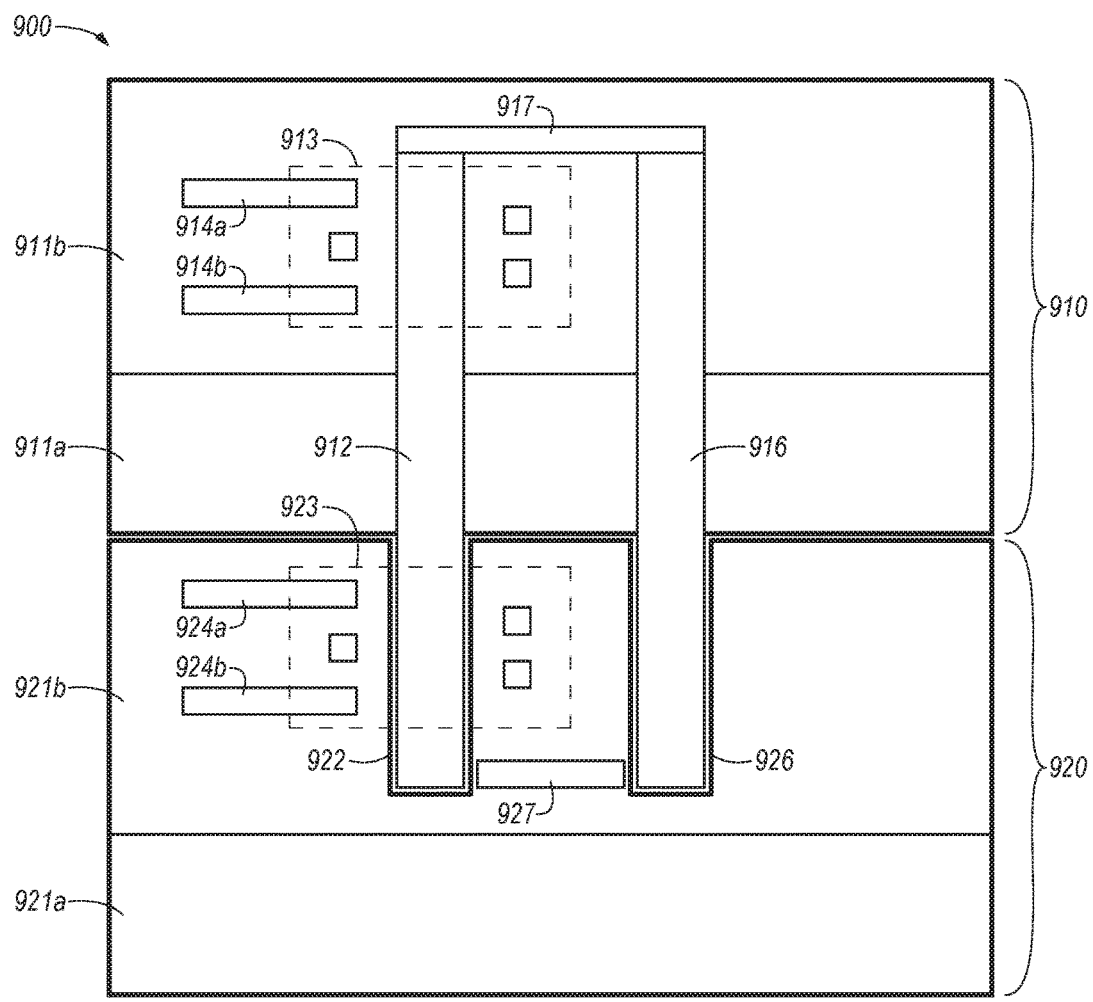
FIG. 9 is a simplified cross-sectional view of a multi-die semiconductor device including coupled inductors with through-substrate via cores configured in accordance with an embodiment of the present technology.

The foregoing example embodiments have illustrated inductors having an open core (e.g., a core wherein the magnetic field passes through a higher magnetic permeability material for only part of the path of the magnetic field), but embodiments of the present technology can also be provided with a closed core. For example, FIG. 9 is a simplified cross-sectional view of a multi-die semiconductor device 900 including coupled inductors with TSV cores configured in accordance with an embodiment of the present technology. Referring to FIG. 9, the device 900 includes a first die 910 and a second die 920. The first die 910 includes a first substrate 911a and a first insulating material 911b. The device 900 further includes first and second TSVs 912 and 916 that extend at least substantially through the first die 910 (e.g., extending from approximately the top surface of the first insulating material 911b and down through the first substrate 911a). A portion 912a of the first TSV 912 extends below the bottom surface of the first substrate 911a, as does a portion 916a of the second TSV 916. The first and second TSVs 912 and 916 are coupled above the first conductor 913 by an upper coupling member 917. The first die 910 also includes a first substantially helical conductor 913 ("conductor 913") disposed around the first TSV 912. In the present embodiment, the first conductor 913 is shown to include two complete turns around the first TSV 912. The first conductor 913 can be operably connected to other circuit elements (not shown) by leads 914a and 914b.

The second die 920 includes a second substrate 921a and a second insulating material 921b. The second die 920 further includes first and second openings 922 and 926 extending from a top surface of the second insulating material 921b to nearly a top surface of the second substrate 921a (e.g., with a small layer of the second insulating material 921b covering the second substrate 921a). The second die 920 further includes a lower coupling member 927 between the first and second openings 922 and 926. The second die 920 further includes a second substantially helical conductor 923 ("conductor 923") disposed around the first opening 922. In the present embodiment, the second conductor 923 is shown to include two complete turns around the opening 922. The second conductor 923 can be operably connected to other circuit elements (not shown) by leads 924a and 924b.

According to one embodiment, the first conductor 913 can be configured to induce a magnetic field in the two TSVs 912 and 916, together with the upper and lower coupling members 917 and 927, in response to a current passing through the first conductor 913 (e.g., provided by a voltage differential applied across the leads 914a and 914b). By changing the current passing through the first conductor 913 (e.g., by applying an alternating current, or by repeatedly switching between high and low voltage states), a changing magnetic field can be induced in the two TSVs 912 and 916 and the upper and lower coupling members 917 and 927, which in turn induces a changing current in the second conductor 923. In this fashion, signals and/or power can be coupled between a circuit comprising the first conductor 913 and another comprising the second conductor 923.

The upper coupling member 917 and the lower coupling member 927 can include a magnetic material, having a magnetic permeability higher than that of the first and second substrates 911a and 921a and/or the first and second insulating materials 911b and 921b. The magnetic material of the upper and lower coupling members 917 and 927 can be either the same material as that of the two TSVs 912 and 916, or a different material. The magnetic material of the upper and lower coupling members 917 and 927 can be a bulk material (e.g., nickel, iron, cobalt, niobium, or an alloy thereof), or a laminated material with differing layers (e.g., of magnetic material and non-magnetic material). Laminated layers of magnetic and non-magnetic material can help to reduce eddy current losses in the upper and lower coupling members 917 and 927. In accordance with one aspect of the present technology, the two TSVs 912 and 916, together with the upper coupling member 917 and the lower coupling member 927, can provide a substantially closed path for the magnetic field induced by the first conductor 913, such that the inductance of the device 900 is greater than it would be if only the two TSVs 912 and 916 were provided.

Although in the embodiment illustrated in FIG. 9, two coupled inductors on proximate are shown with the same number of turns, in other embodiments of the present technology different numbers of windings can be provided on similarly-configured inductors. As will be readily understood by one skilled in the art, by providing coupled inductors with different numbers of windings, a device so configured can be operated as a step-up or step-down transformer (depending upon which conductor is utilized as the primary winding and which the secondary winding).

Although in the example embodiment illustrated in FIG. 9, coupled inductors are illustrated sharing a closed core (e.g., a core in which a substantially continuous path of high magnetic permeability material passes through the middle of a conductive winding), in other embodiments, one or both of the upper and lower coupling members 917 and 927 could be omitted. In such an embodiment, a secondary TSV (e.g., in addition to the TSV around which the windings are disposed) with elevated magnetic permeability could be situated near the TSV around which the windings are disposed to provide an open core embodiment with improved inductance over an embodiment in which the secondary TSV was not present. Moreover, although the example embodiment of FIG. 9 illustrates a two-die arrangement, in which the upper coupling member is disposed in the same die as the TSVs, and the lower coupling member is in a lower die, other arrangements of the present technology are possible. For example, in a three die arrangement, an upper coupling member may be in an upside-down uppermost die, a lower coupling member in a lowermost die, with no coupling member in the die with the TSVs. Alternatively, in a two die arrangement in which portions of the TSVs extend upwards out of an insulating material, the upper coupling member may be in an upside-down upper die, and the lower coupling member in the die with the TSVs.

According to one embodiment, a closed magnetic core, such as is illustrated by way of example in FIG. 9, can provide additional space in which one or more windings can be disposed (e.g., to provide a transformer or power couple). For example, although FIG. 9 illustrates a device in which two windings are disposed on the same TSV 912, with a proximate TSV 916 having no windings, in another embodiment, two proximate TSVs could be provided with a single winding on each TSV. Alternatively, additional windings can be provided in the space provided by a closed magnetic core or a proximate TSV in an open-core embodiment, to provide more than two coupled inductors that all interact with the same magnetic field.

Although in the embodiment illustrated in FIG. 9 a single additional TSV is provided to enhance the magnetic permeability of the return path for the magnetic field generated by a primary winding around a first TSV, in other embodiments of the present technology multiple return path TSVs can be provided to further improve the inductance of the inductors so configured. For example, embodiments of the present technology may use two, three, four, or any number of additional TSVs to provide a return path for the magnetic field with enhanced magnetic permeability. Such additional TSV may be coupled by upper and/or lower coupling members to the TSV around which one or more substantially helical conductors are disposed (e.g., a closed core configuration), or may merely be sufficiently proximate to concentrate some of the magnetic flux of the return path of the magnetic field to enhance the performance of the device so configured.

Figure 10:
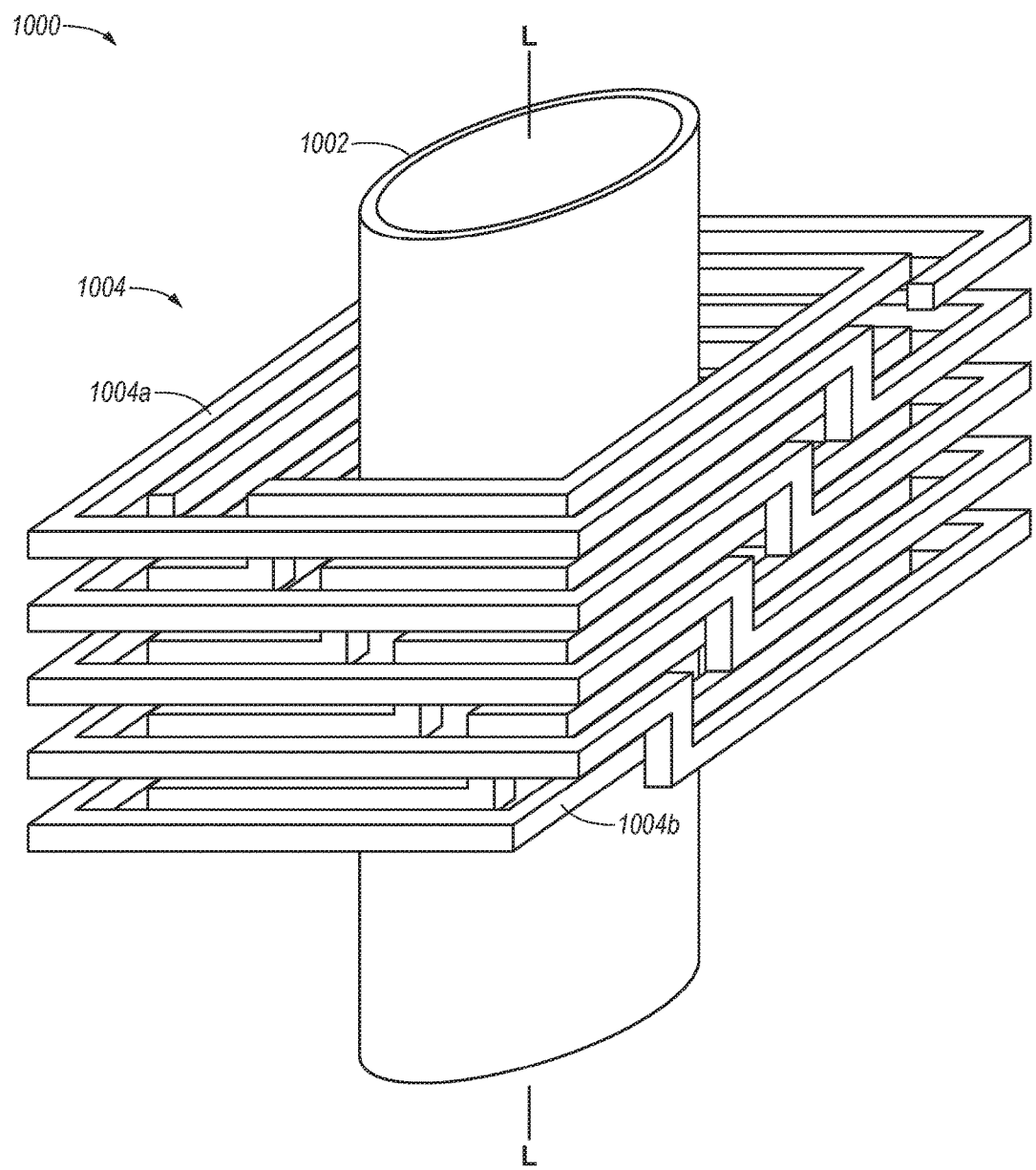
FIG. 10 is a simplified perspective view of a substantially helical conductor disposed around a through-substrate via configured in accordance with an embodiment of the present technology.

Although in the foregoing example embodiments, each substantially helical conductor has been illustrated as having a single turn about a TSV at a given distance from the surface of a corresponding substrate, in other embodiments a substantially helical conductor can have more than one turn about a TSV at the same distance from the substrate surface (e.g., multiple turns arrange coaxially at each level). For example, FIG. 10 is a simplified perspective view of a substantially helical conductor 1004 ("conductor 1004") disposed around a through-substrate via 1002 configured in accordance with an embodiment of the present technology. As can be seen with reference to FIG. 10, the conductor 1004 includes a first substantially helical conductor 1004a ("conductor 1004a") disposed around the TSV 1002, which is connected to a second coaxially-aligned substantially helical conductor 1004b ("conductor 1004b"), such that a single conductive path winds downward around TSV 1002 at a first average radial distance, and winds back upward around TSV 1002 at a second average radial distance. Accordingly, the conductor 1004 includes two turns about the TSV 1002 (e.g., the topmost turn of conductor 1004a and the topmost turn of conductor 1004b) at the same position along the longitudinal dimension "L" of the TSV 1002. In another embodiment, a substantially helical conductor could make two turns about a TSV at a first level (e.g., spiraling outward), two turns about a TSV at a second level (e.g., spiraling inward), and so on in a similar fashion for as many turns as were desired.

Figure 11A:
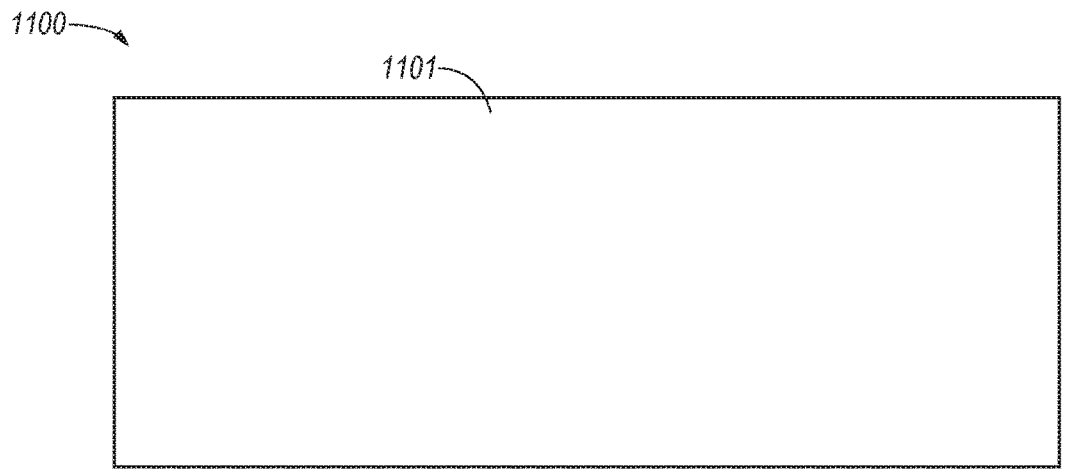
FIGS. 11A through 11H are simplified cross-sectional and perspective views of a multi-die semiconductor device including coupled inductors with a through-substrate via core at various stages of a manufacturing process in accordance with an embodiment of the present technology.
Figure 11B:
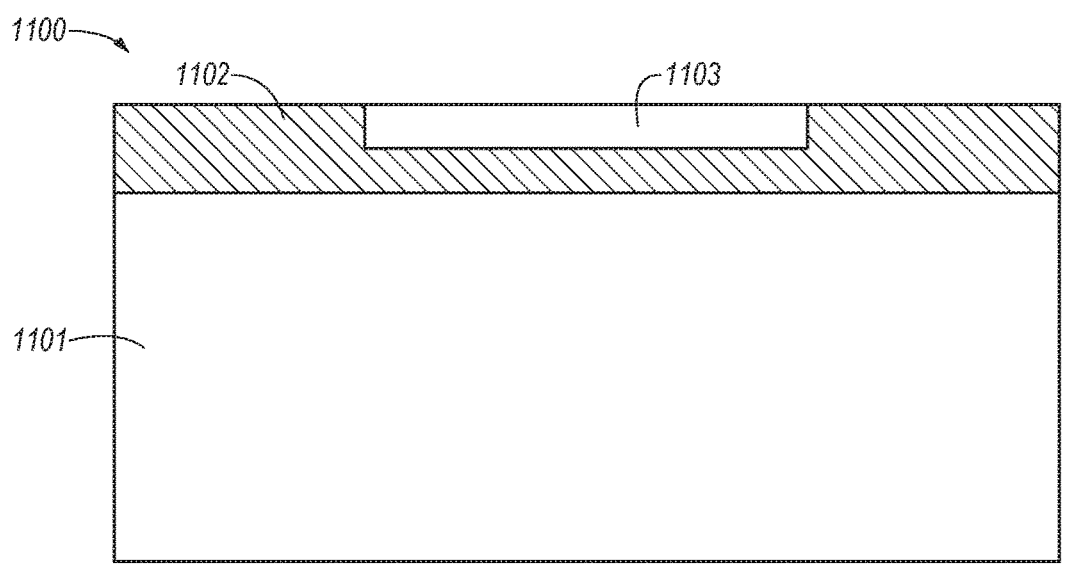

FIGS. 11A-11H are simplified views of a device 1100 having an inductor with a through-substrate via core in various states of a manufacturing process in accordance with an embodiment of the present technology. In FIG. 11a, a substrate 1101 is provided, in anticipation of further processing steps. The substrate 1101 may be any one of a number of substrate materials, including silicon, glass, gallium arsenide, gallium nitride, an organic laminate, molding compound (e.g., for reconstituted wafers for fan-out wafer-level processing) and the like. In FIG. 11B, a first turn 1103 of a substantially helical conductor has been disposed in a layer of the material 1102 over the substrate 1101. The insulating material 1102 can be any one of a number of insulating materials which are suitable for semiconductor processing, including silicon oxide, silicon nitride, polyimide, or the like. The first turn 1103 of the conductor can be any one of a number of conducting materials which are suitable for semiconductor processing, including copper, gold, tungsten, alloys thereof, or the like.

Figure 11C:
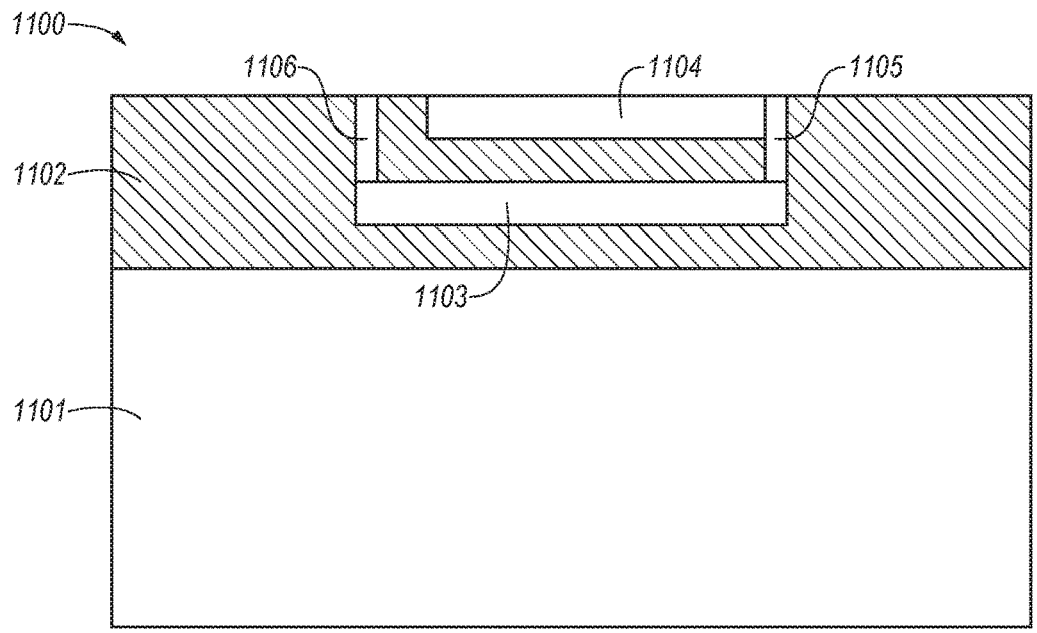
Figure 11D:
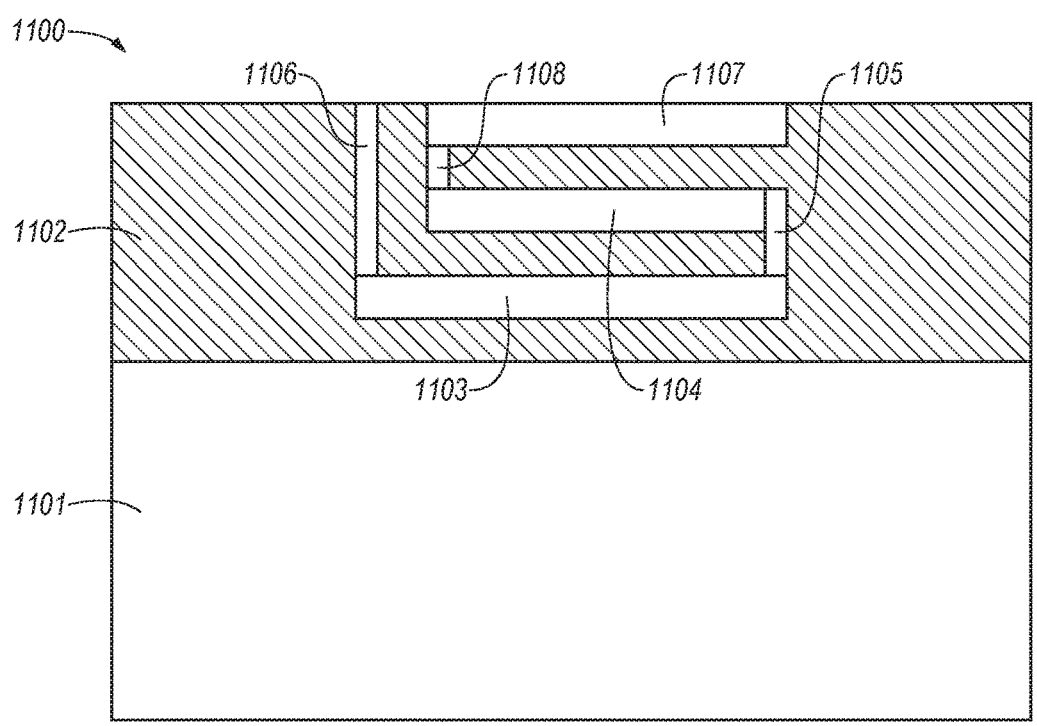

In FIG. 11C, a second turn 1104 of the substantially helical conductor has been disposed in the now thicker layer of the insulating material 1102, and spaced from the first turn 1103 by a layer of the insulating material 1102. The second turn 1104 is electrically connected to the first turn 1103 by a first via 1105. A second via 1106 has also been provided to route an end of the first turn 1103 to an eventual higher layer of the device 1100. In FIG. 11D, a third turn 1107 of the substantially helical conductor has been disposed in the now thicker layer of the insulating material 1102, and spaced from the second turn 1104 by a layer of the insulating material 1102. The third turn 1107 is electrically connected to the second turn 1104 by a third via 1108. The second via 1106 has been further extended to continue routing an end of the first turn 1103 to an eventual higher layer of the device 1100.

Figure 11E:
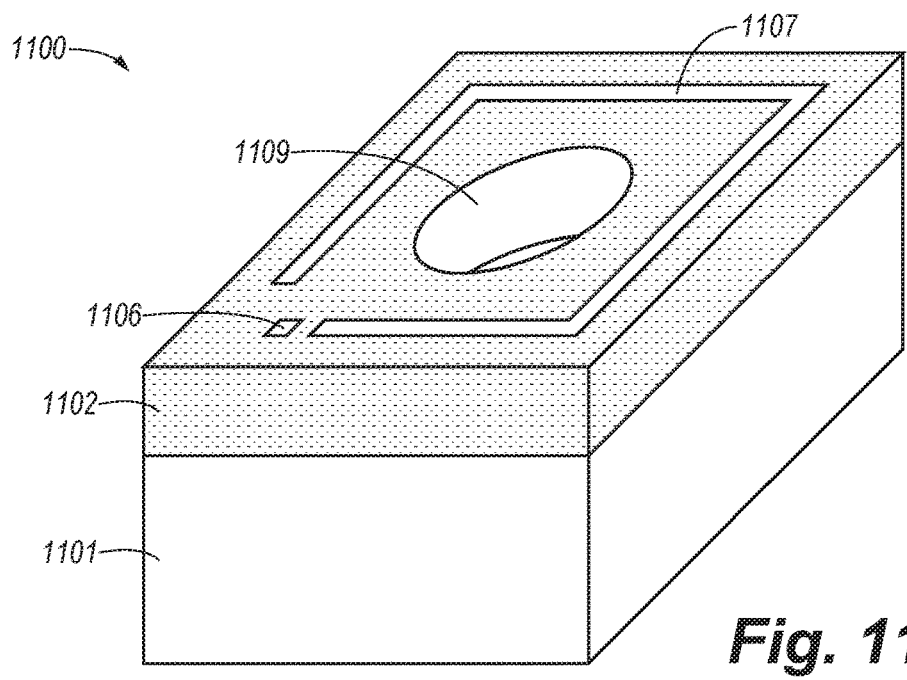
Figure 11F:
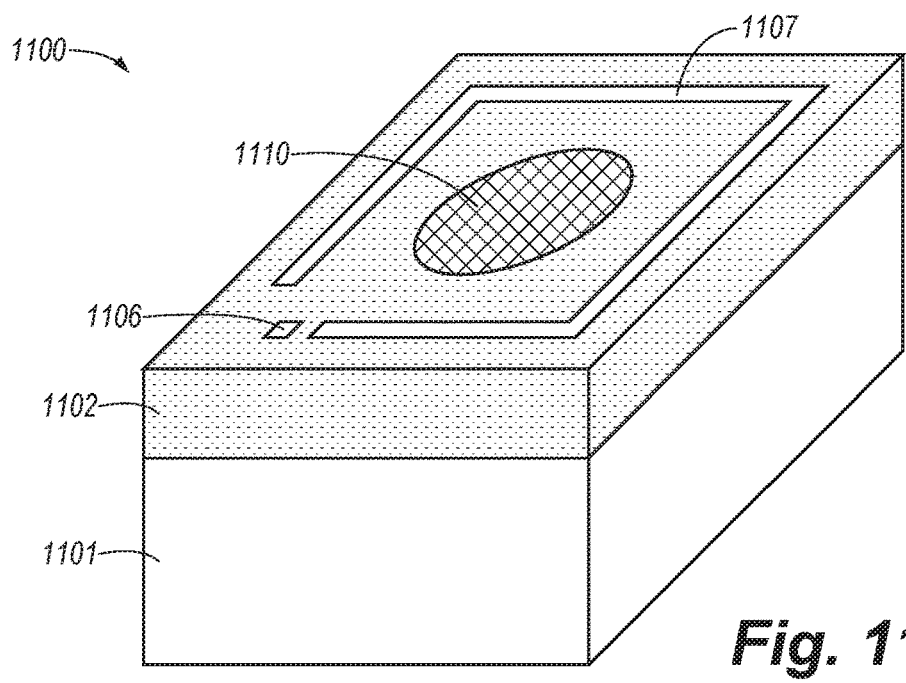

Turning to FIG. 11E, the device 1100 is illustrated in a simplified perspective view after an opening 1109 has been etched through the insulating material 1102 and into the substrate 1101. The opening 1109 is etched substantially coaxially with the turns 1103, 1104 and 1107 of the substantially helical conductor using any one of a number of etching operations capable of providing a substantially vertical opening with a high aspect ratio. For example, deep reactive ion etching, laser drilling, or the like can be used to form the opening 909. In FIG. 11F, a TSV 1110 has been disposed in the opening 1109. The TSV 1110 can include a magnetic material (e.g., a material with a higher magnetic permeability than the substrate 1101 and/or the insulating material 1102) to increase the magnetic field in the TSV 1110 when current is flowing through the substantially helical conductor. The magnetic material can be ferromagnetic, ferrimagnetic, or a combination thereof. The TSV 1110 can include more than one material, either in a bulk material of a single composition or in discrete regions of different materials (e.g., coaxial laminate layers). For example, the TSV 1110 can include nickel, iron, cobalt, niobium, or alloys thereof. Laminated layers of magnetic and non-magnetic material can help to reduce eddy current losses in the TSV 1110. The TSV 1110 can be provided in a single metallization step filling in the opening 1109, or in multiple steps of laminating layers (e.g., multiple magnetic layers separated by non-magnetic layers). In one embodiment, to provide a TSV with a multiple layer structure, a mixture of conformal and bottom-up fill plating operations can be utilized (e.g., a conformal plating step to partially fill and narrow the etched opening with a first material, and a subsequent bottom-up plating step to completely fill the narrowed opening with a second material).

Figure 11G:
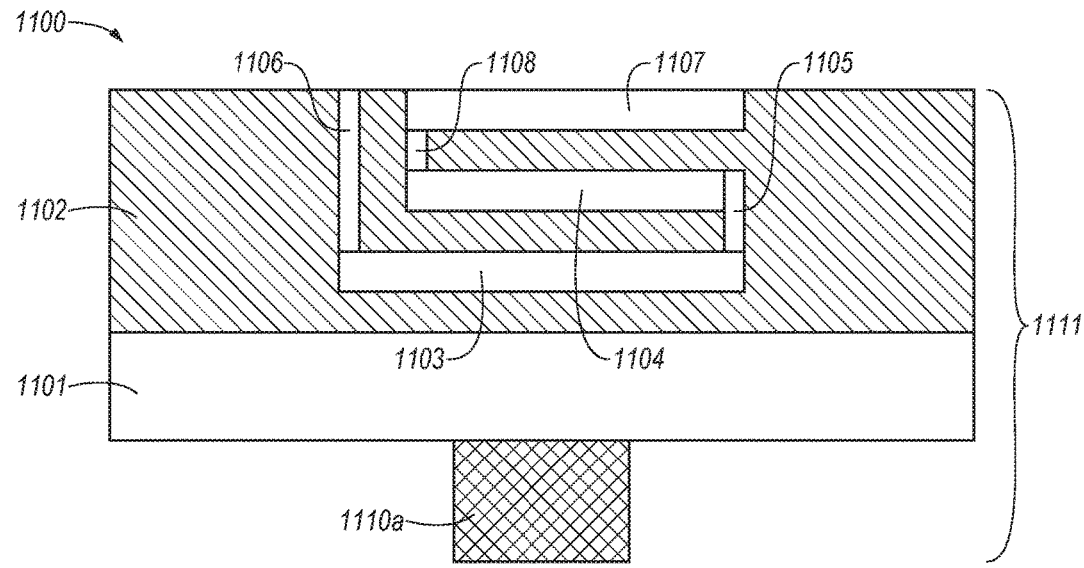
Figure 11H:
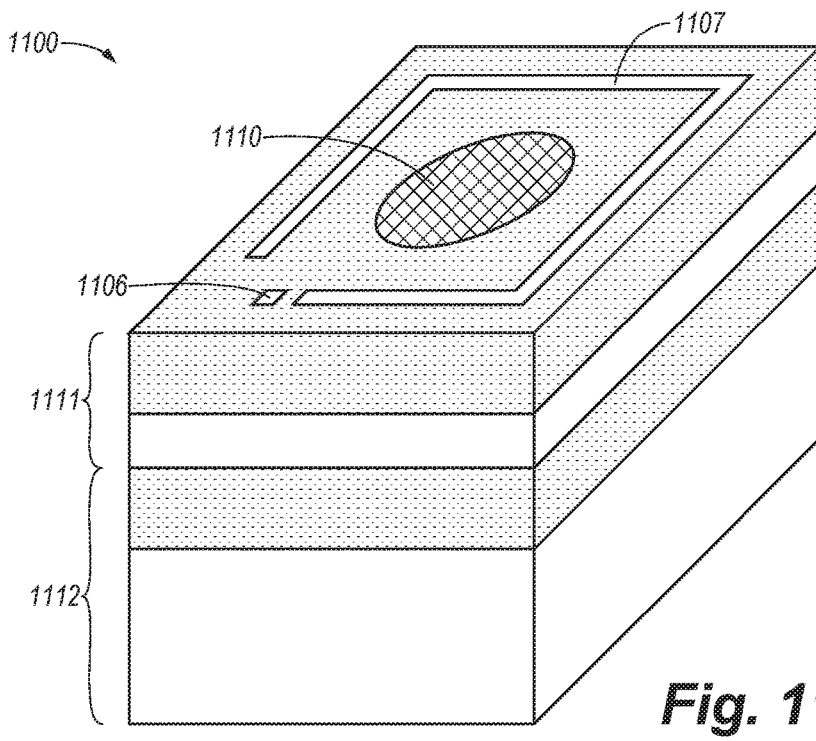

Turning to FIG. 11G, the device 1100 is illustrated after the substrate 1101 has been thinned to expose a portion 1110a of the TSV 1110 extending below a bottom surface of the substrate 1101, to provide a thinned die 1111. In FIG. 11H, the device 1100 is illustrated after the thinned die 1111 has been disposed over a second die 1112 in which an opening is surrounded by a substantially helical conductor (e.g., a die similar to that illustrated with respect to FIG. 11E, but having an additional layer of insulating material covering the third turn 1107 of the substantially helical conductor). The portion 1110a of the TSV 1110 is disposed in the opening of the second die 1112, such that the substantially helical conductor of the second die 1112 is disposed around the portion 1110a of the TSV 1110.

Figure 12:
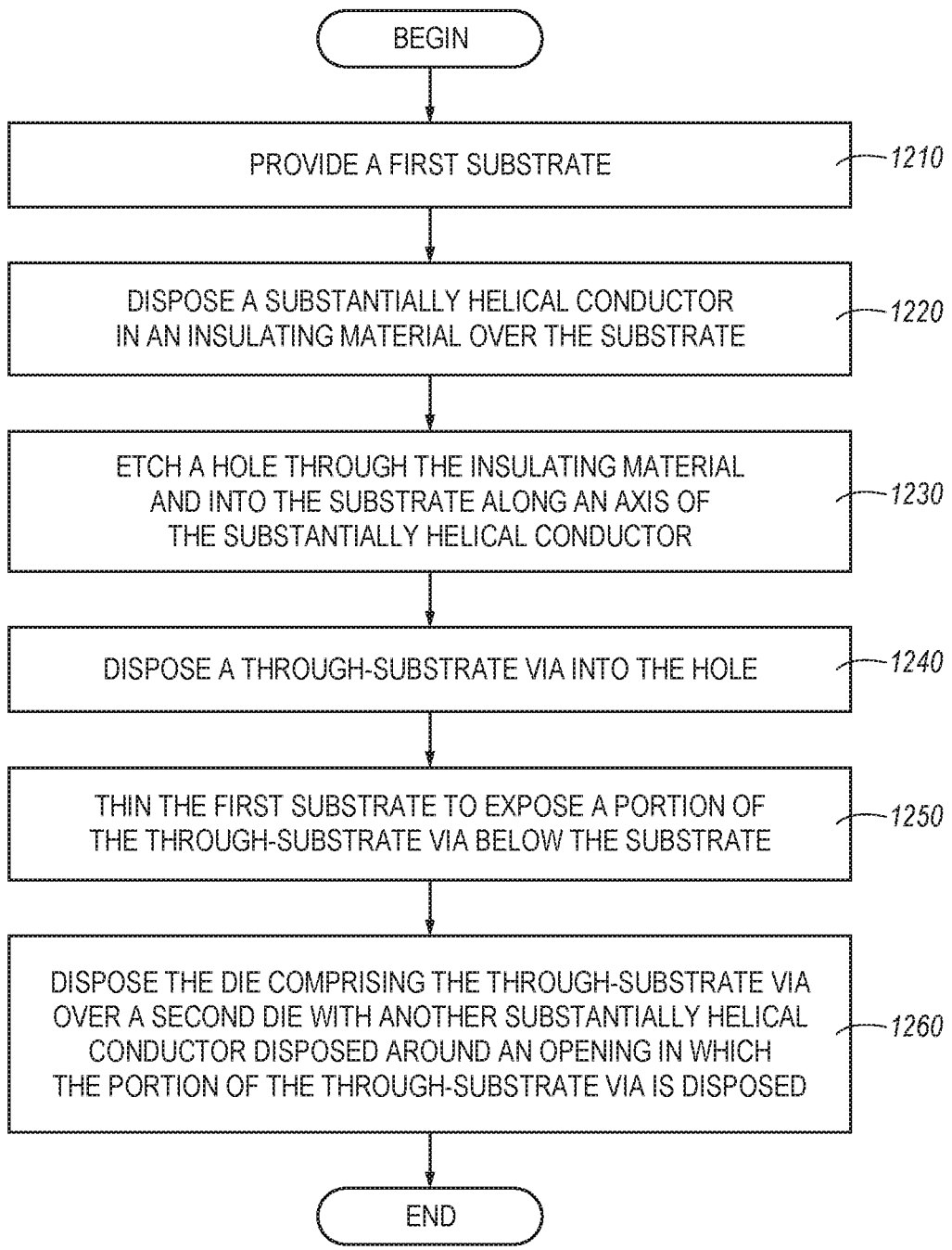
FIG. 12 is a flow chart illustrating a method of manufacturing a multi-die semiconductor device including coupled inductors with a through-substrate via core in accordance with an embodiment of the present technology.

FIG. 12 is a flow chart illustrating a method of manufacturing an inductor with a through-substrate via core in accordance with an embodiment of the present technology. The method begins in step 1210, in which a substrate is provided. In step 1220, a substantially helical conductor is disposed in an insulating material over the substrate. In step 1230, a hole is etched through the insulating material and into the substrate along an axis of the substantially helical conductor. In step 1240, a TSV is disposed into the hole. In step 1250, the substrate is thinned to expose a portion of the TSV below the substrate. In step 1260, the die comprising the TSV is disposed over a second die with another substantially helical conductor disposed around an opening in which the portion of the TSV is disposed.

Figure 13:
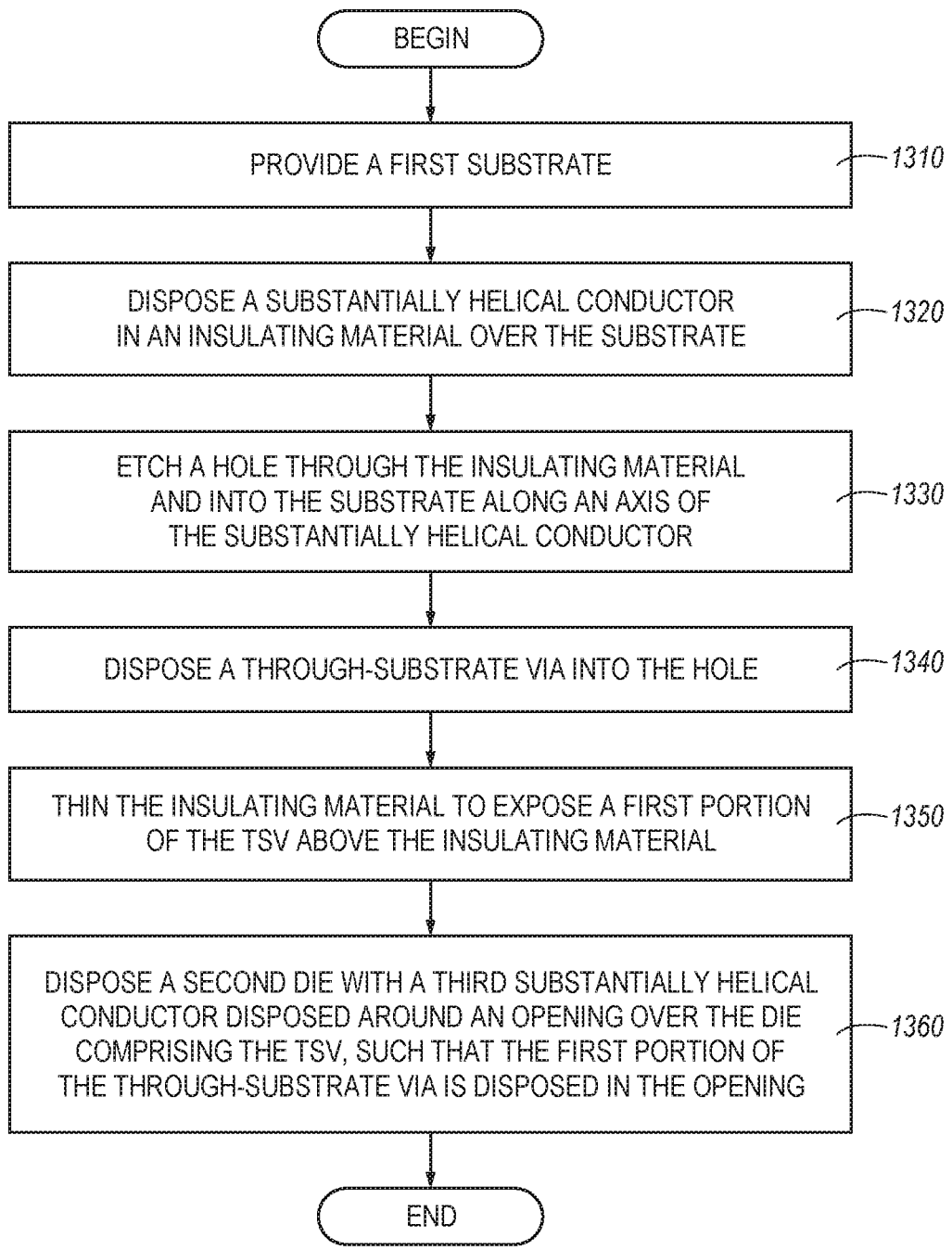
FIG. 13 is a flow chart illustrating a method of manufacturing a multi-die semiconductor device including coupled inductors with a through-substrate via core in accordance with an embodiment of the present technology.

FIG. 13 is a flow chart illustrating a method of manufacturing an inductor with a through-substrate via core in accordance with an embodiment of the present technology. The method begins in step 1310, in which a substrate is provided. In step 1320, a substantially helical conductor is disposed in an insulating material over the substrate. In step 1330, a hole is etched through the insulating material and into the substrate along an axis of the substantially helical conductor. In step 1340, a TSV is disposed into the hole. In step 1350, the insulating material is thinned to expose a first portion of the TSV above the insulating material. In step 1360, a second die with a second substantially helical conductor disposed around an opening is disposed over the die comprising the TSV, such that the first portion of the TSV is disposed in the opening of the second die.

Figure 14:
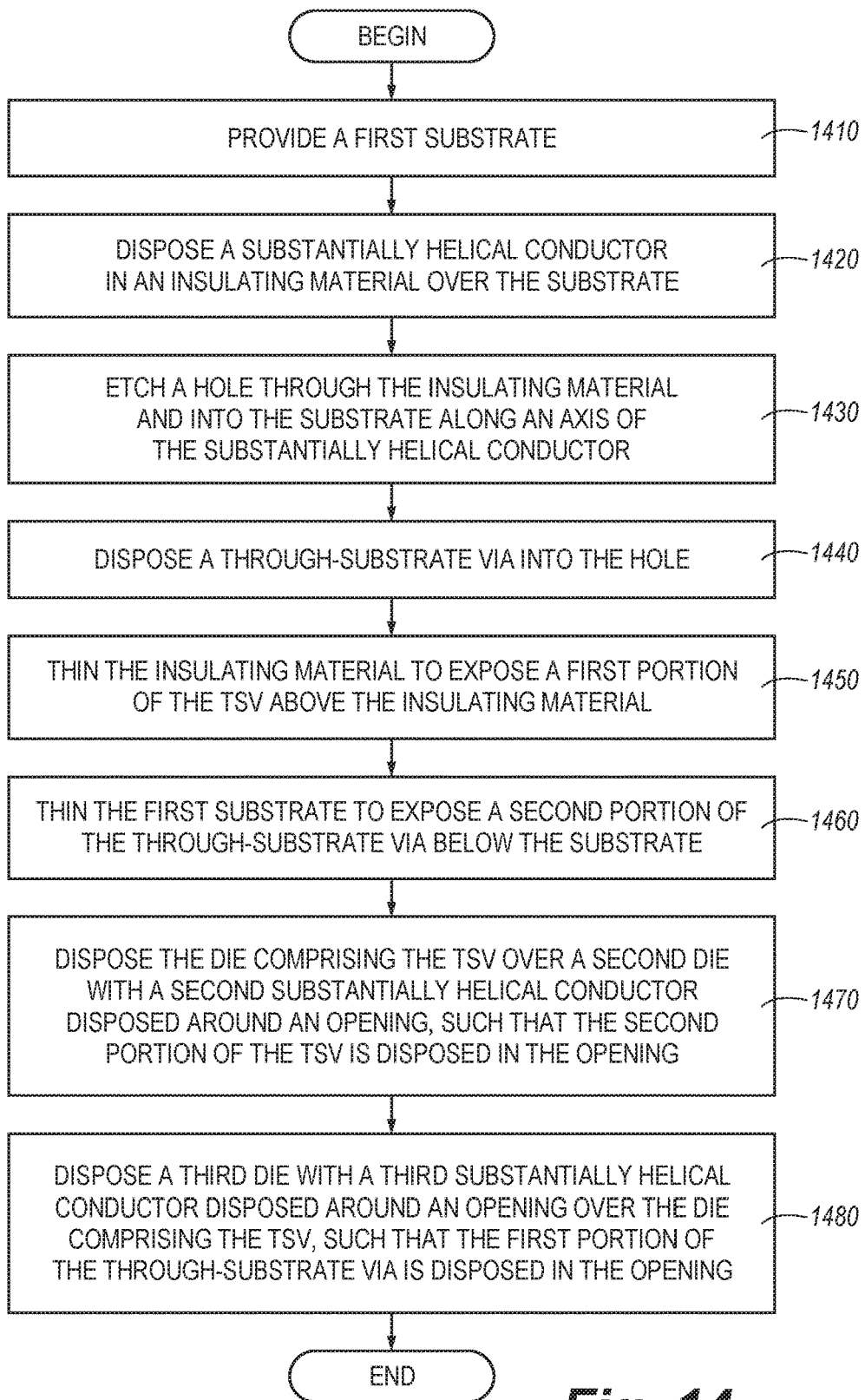
FIG. 14 is a flow chart illustrating a method of manufacturing a multi-die semiconductor device including coupled inductors with a through-substrate via core in accordance with an embodiment of the present technology.

FIG. 14 is a flow chart illustrating a method of manufacturing an inductor with a through-substrate via core in accordance with an embodiment of the present technology. The method begins in step 1410, in which a substrate is provided. In step 1420, a substantially helical conductor is disposed in an insulating material over the substrate. In step 1430, a hole is etched through the insulating material and into the substrate along an axis of the substantially helical conductor. In step 1440, a TSV is disposed into the hole. In step 1450, the insulating material is thinned to expose a first portion of the TSV above the insulating material. In step 1460, the substrate is thinned to expose a second portion of the TSV below the substrate. In step 1470, the die comprising the TSV is disposed over a second die with a second substantially helical conductor disposed around an opening, such that the second portion of the TSV is disposed in the opening of the second die. In step 1480, a third die with a third substantially helical conductor disposed around an opening is disposed over the die comprising the TSV, such that the first portion of the TSV is disposed in the opening of the third die.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device, comprising:
    a first die including:
        a first surface,
        a through-substrate via (TSV) extending at least substantially through the first die, the TSV having a portion extending past the first surface, and
        a first substantially helical conductor disposed around the TSV; and
    a second die including:
        a second surface,
        an opening in the second surface in which the portion of the TSV is disposed, and
        a second substantially helical conductor disposed around the opening.

2. The semiconductor device of claim 1, wherein the first substantially helical conductor is configured to induce a change in a magnetic field in the TSV in response to a first changing current in the first substantially helical conductor, and wherein the second substantially helical conductor is configured to have a second changing current induced therein in response to the change in the magnetic field in the portion of TSV.

3. The semiconductor device of claim 1, wherein the first die further includes:
    a second TSV extending at least substantially through the first die, the second TSV having a portion extending past the first surface, and
    a third substantially helical conductor disposed around the second TSV, and
    wherein the second die further includes:
    a second opening in the second surface in which the portion of the second TSV is disposed, and
    a fourth substantially helical conductor disposed around the second opening.

4. The semiconductor device of claim 1, wherein the TSV comprises a ferromagnetic or a ferrimagnetic material.

5. The semiconductor device of claim 1, wherein the first substantially helical conductor comprises a different number of turns around the TSV than the second substantially helical conductor.

6. The semiconductor device of claim 1, wherein the first and second substantially helical conductors comprise a same number of turns around the TSV.

7. The semiconductor device of claim 1, wherein the first and second substantially helical conductors are coaxially aligned with the TSV.

8. The semiconductor device of claim 1, wherein the first substantially helical conductor comprises more than one turn around the TSV, and the second substantially helical conductor comprises more than one turn around the TSV.

9. The semiconductor device of claim 1, wherein the first substantially helical conductor and the second substantially helical conductor are electrically isolated from each other and from the TSV.

10. The semiconductor device of claim 1, wherein one of the first and second substantially helical conductors is electrically connected to a power supply and another of the first and second substantially helical conductors is electrically connected to a load.

11. The semiconductor device of claim 1, wherein the first surface is a lower surface of a substrate material of the first die.

12. The semiconductor device of claim 1, wherein the first surface is an upper surface of the first die on an opposite side of the first substantially helical conductor from a substrate material of the first die.

* * * * *